(12) United States Patent  
Morimoto et al.

(10) Patent No.: US 11,894,625 B2  
(45) Date of Patent: Feb. 6, 2024

(54) ANTENNA

(71) Applicant: AGC Inc., Tokyo (JP)

(72) Inventors: Yasuo Morimoto, Tokyo (JP); Takeshi Motegi, Tokyo (JP); Toshiki Sayama, Tokyo (JP); Motoshi Ono, Tokyo (JP); Osamu Kagaya, Tokyo (JP)

(73) Assignee: AGC Inc., Tokyo (JP)

( * ) Notice: Subject to any disclaimer, the term of this patent is extended or adjusted under 35 U.S.C. 154(b) by 246 days.

(21) Appl. No.: 17/643,232

(22) Filed: Dec. 8, 2021

(65) Prior Publication Data

US 2022/0102864 A1 Mar. 31, 2022

Related U.S. Application Data

(63) Continuation of application No. PCT/JP2020/022925, filed on Jun. 10, 2020.

(30) Foreign Application Priority Data

Jun. 11, 2019 (JP) ................... 2019-109115

(51) Int. Cl.
  *H01Q 9/16* (2006.01)
  *H01Q 7/00* (2006.01)
  *H05K 1/02* (2006.01)

(52) U.S. Cl.
  CPC ............... *H01Q 9/16* (2013.01); *H01Q 7/00* (2013.01); *H05K 1/0277* (2013.01); *H05K 2201/10098* (2013.01)

(58) Field of Classification Search
  CPC .................... H01Q 7/00; H01Q 9/16
  See application file for complete search history.

(56) References Cited

U.S. PATENT DOCUMENTS

| 6,211,751 | B1 | 4/2001 | Aoki |
| 2009/0015483 | A1 | 1/2009 | Liu |
| 2009/0015485 | A1 | 1/2009 | Floyd et al. |
| 2009/0015496 | A1 | 1/2009 | Liu |

FOREIGN PATENT DOCUMENTS

| JP | 51-062054 | 5/1976 |
| JP | 61-206288 A | 9/1986 |
| JP | 05-055607 U | 7/1993 |
| JP | 2003-332830 A | 11/2003 |
| WO | WO00/60695 A1 | 10/2000 |
| WO | WO 2018/012701 A1 | 1/2018 |

OTHER PUBLICATIONS

See et al., "A Wideband Ultra-Thin Differential Loop-Fed Patch Antenna for Head Implants", IEEE Transactions on Antennas and Propagation, IEEE, vol. 63, No. 7, Jul. 2015, XP011662458, pp. 3244-3248.

*Primary Examiner* — Graham P Smith  
(74) *Attorney, Agent, or Firm* — Oblon, McClelland, Maier & Neustadt, L.L.P.

(57) ABSTRACT

An antenna includes an antenna conductor to be provided on an exterior side of a chassis and a flexible substrate. The flexible substrate includes a first insulating portion that is a portion of a sheet-shaped dielectric where the sheet-shaped dielectric is folded, a grounding conductor provided between the first insulating portion and the chassis, a second insulating portion that is a portion of the sheet-shaped dielectric where the sheet-shaped dielectric is not folded, and a signal line configured to feed power to the antenna conductor. A thickness of the first insulating portion is greater than a thickness of the second insulating portion.

16 Claims, 39 Drawing Sheets

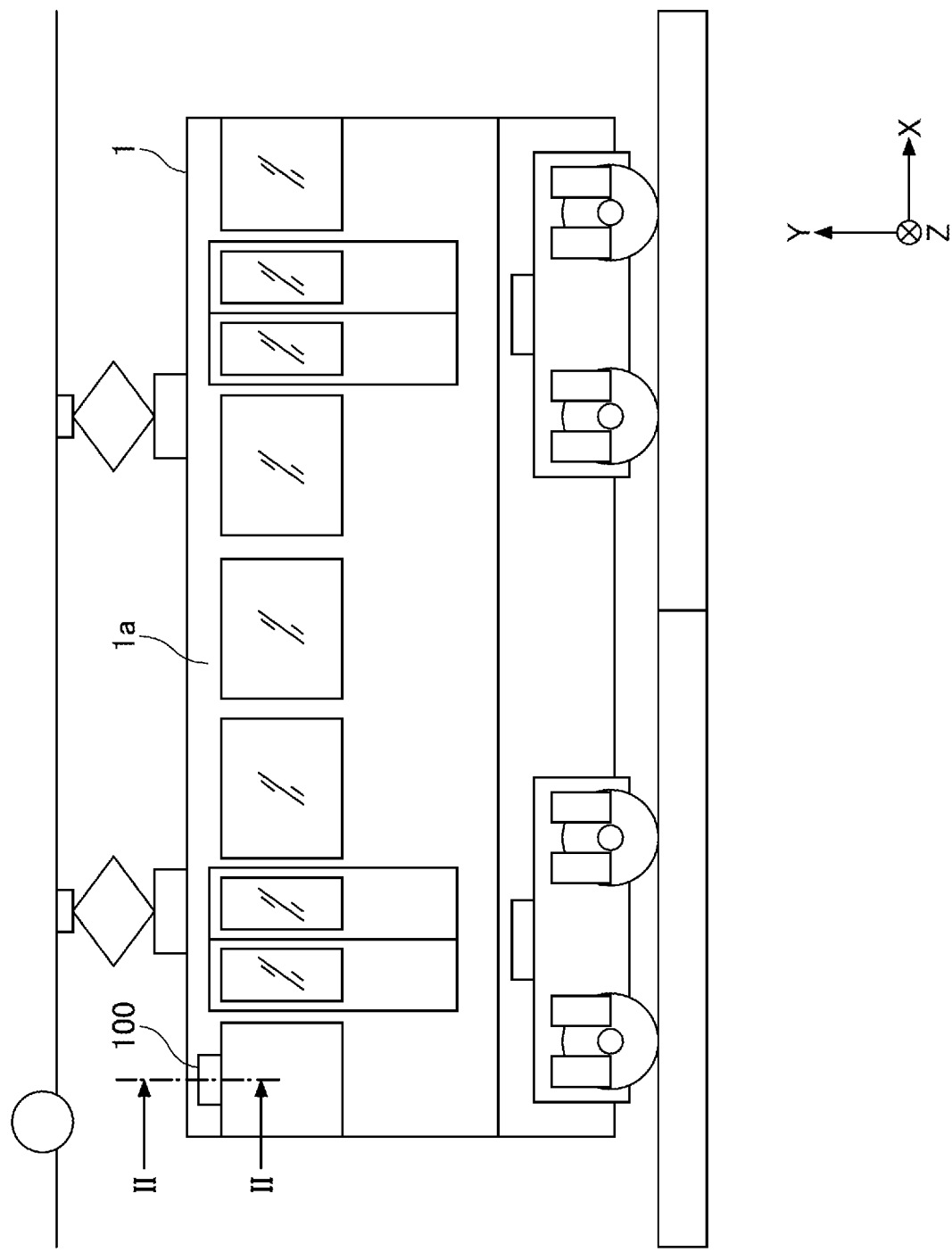

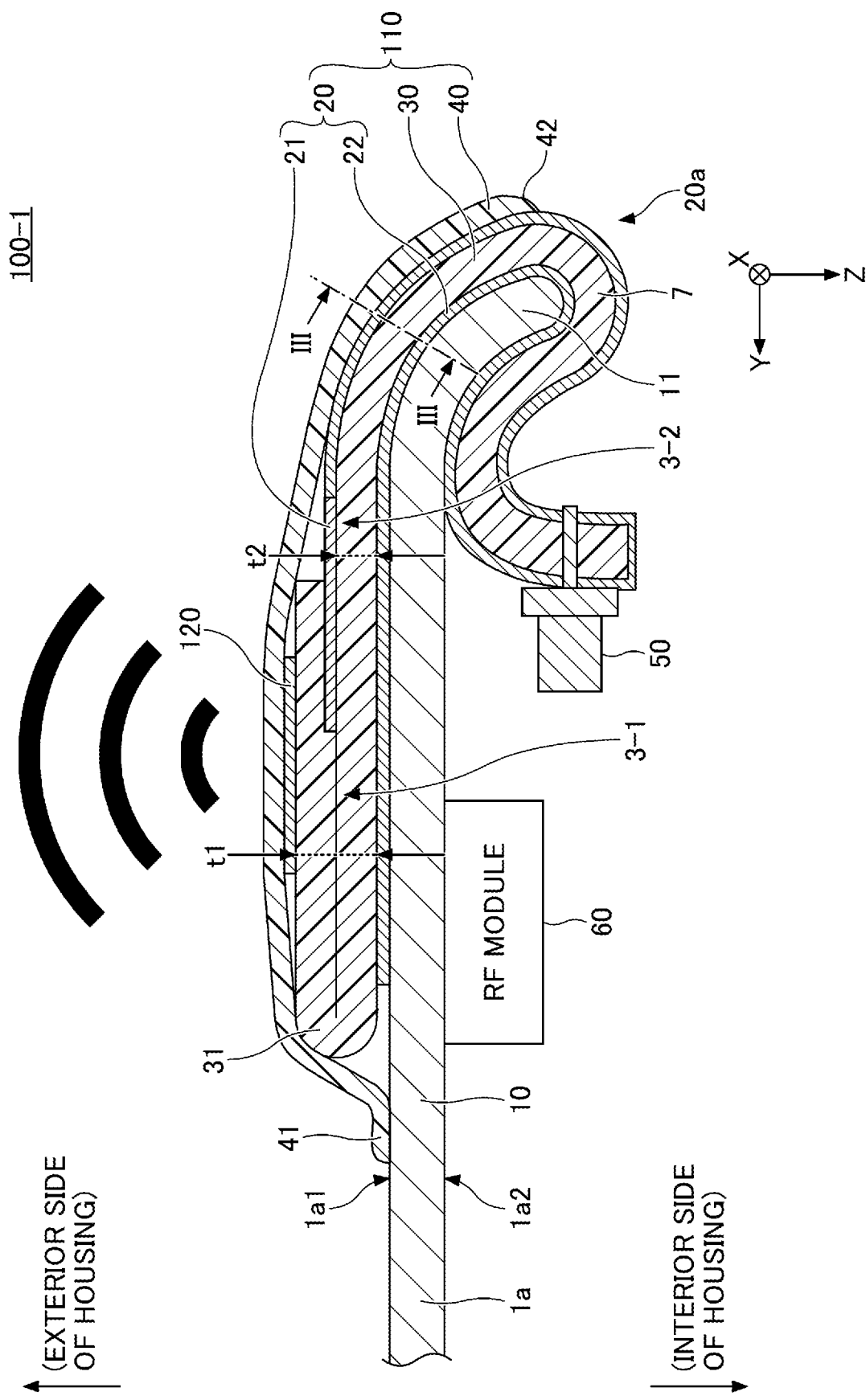

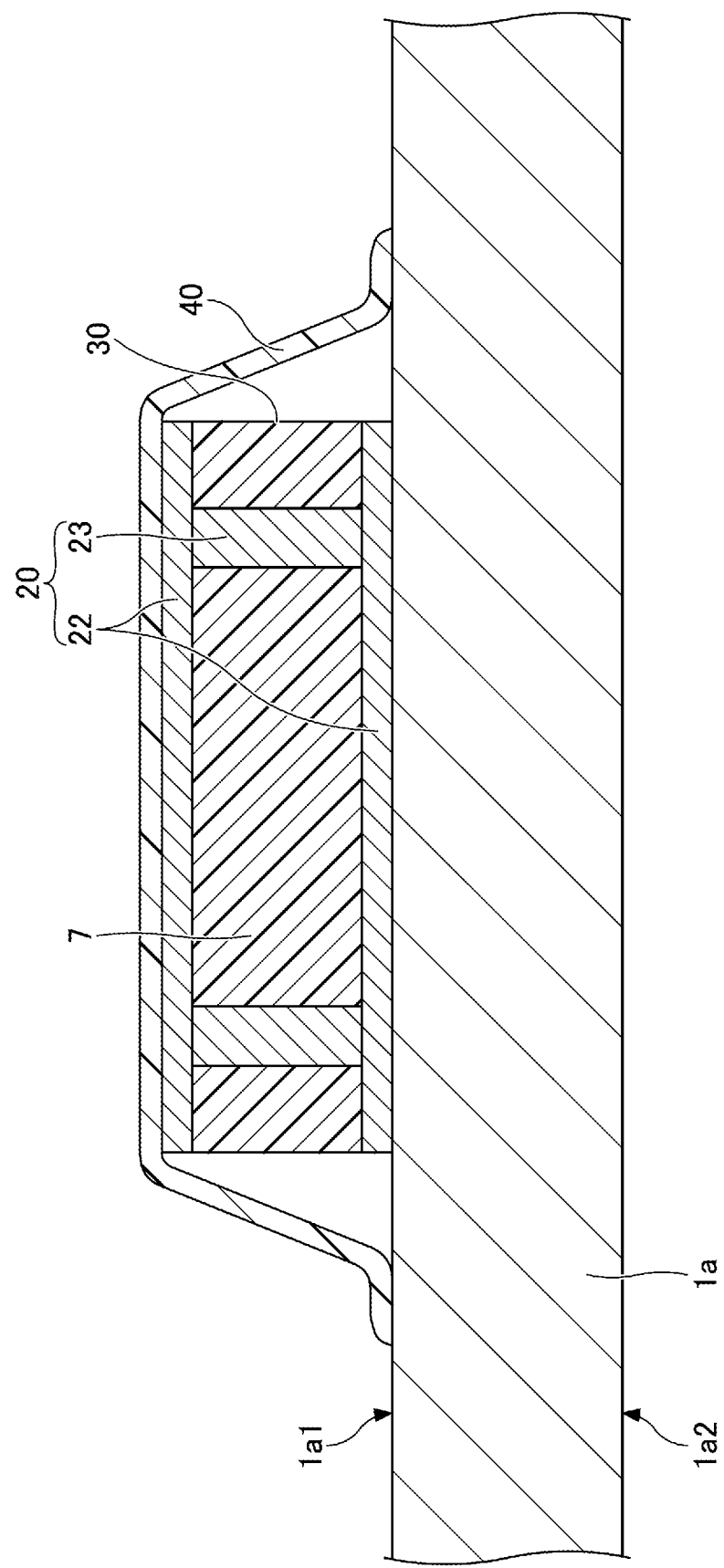

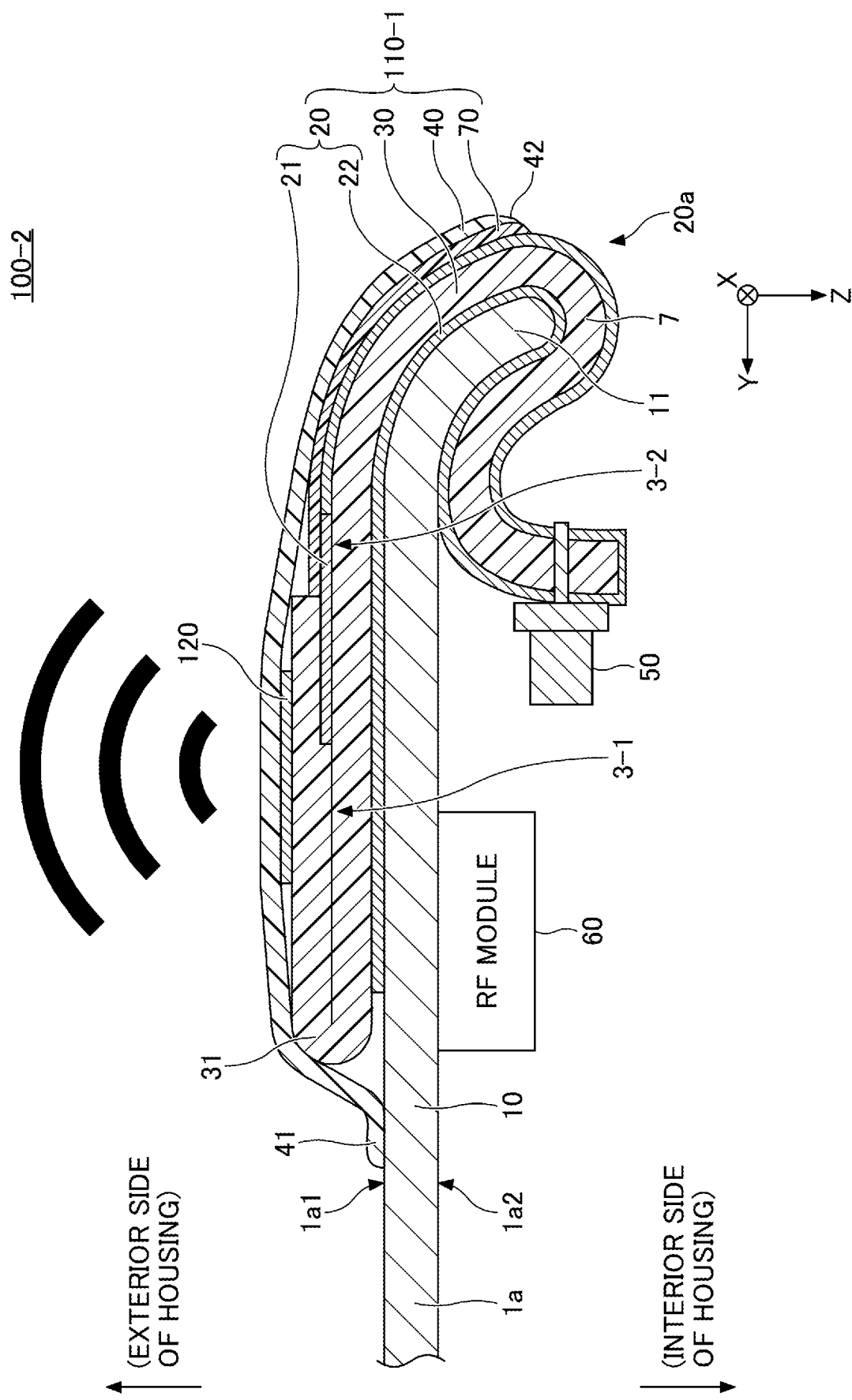

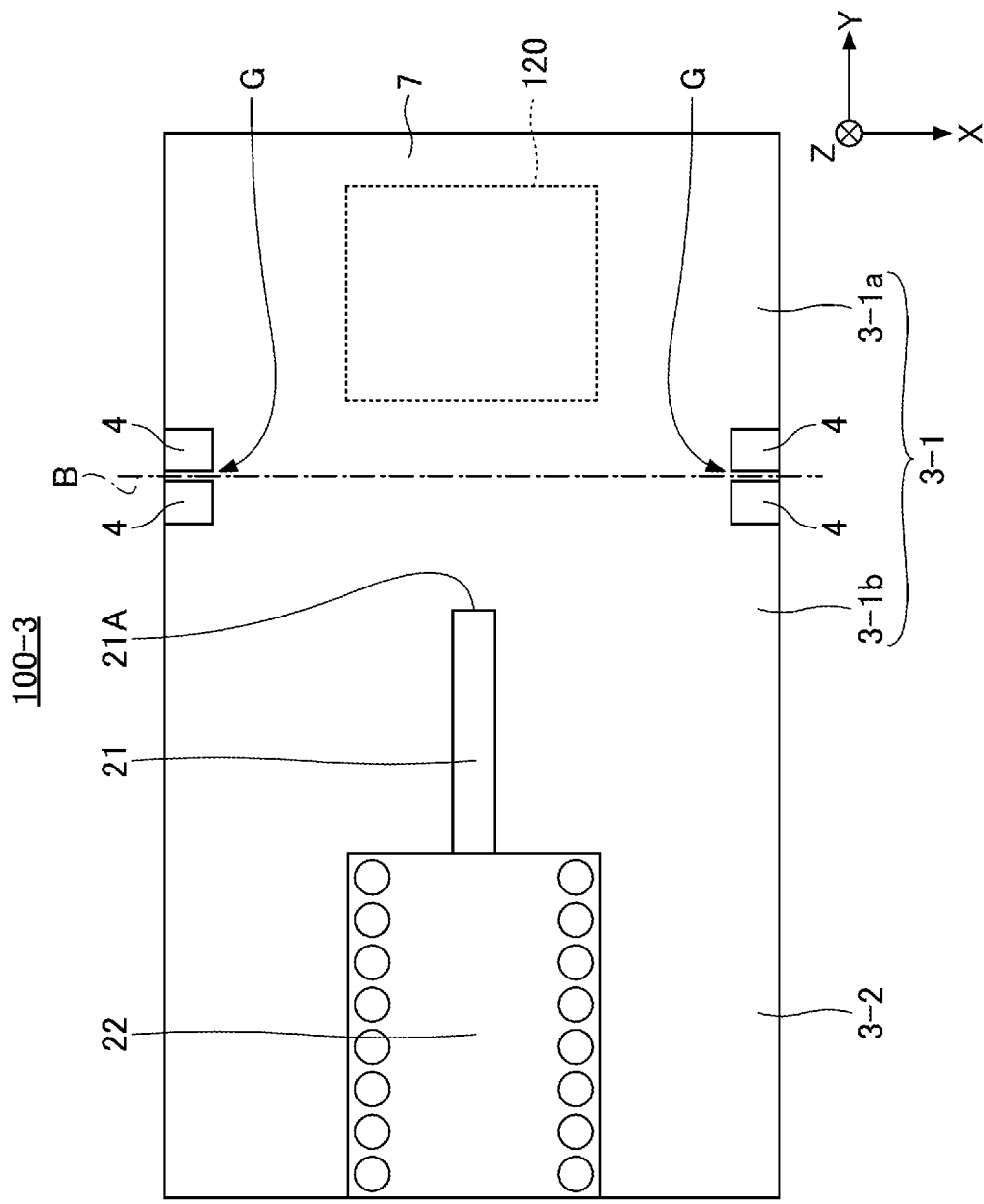

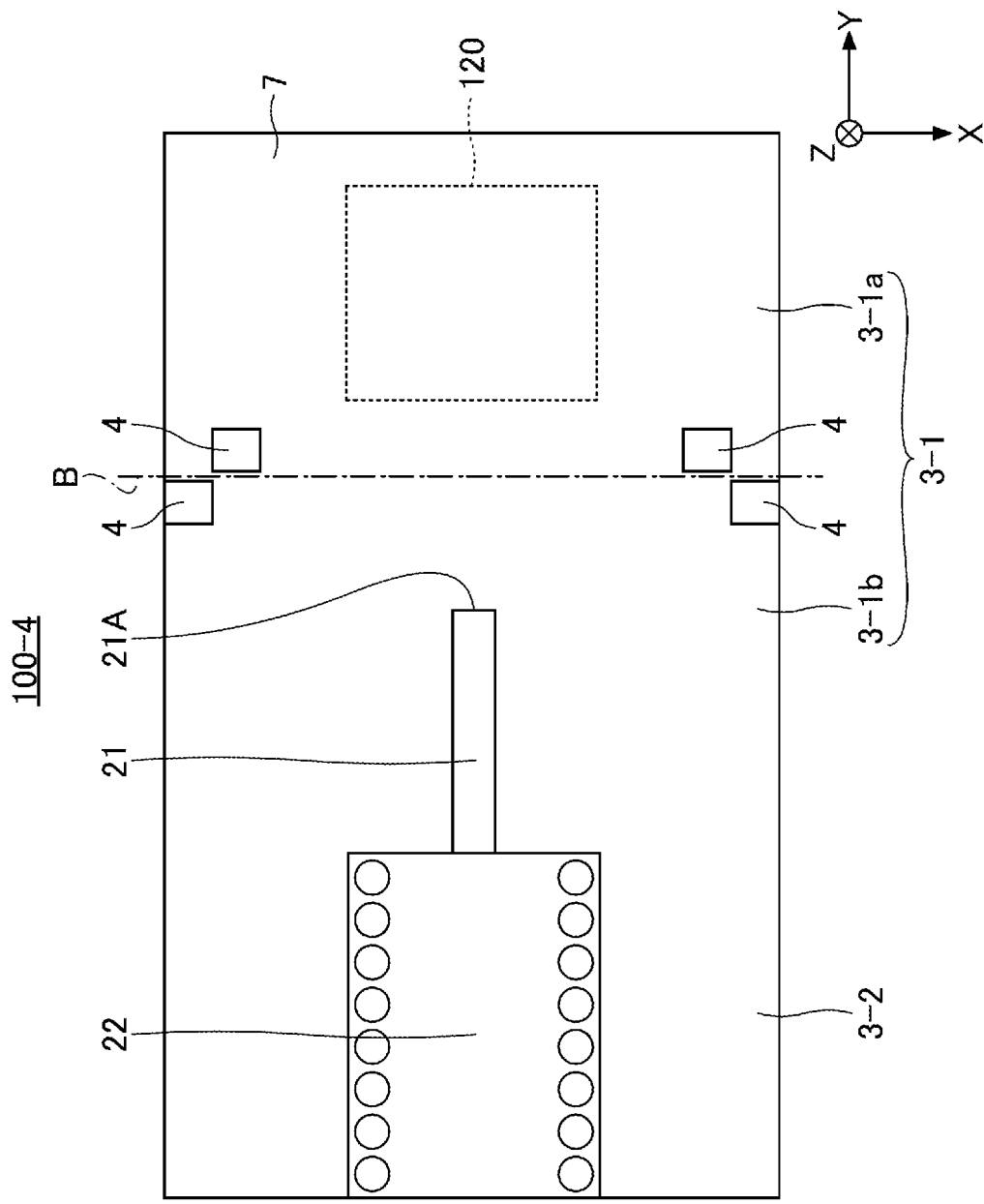

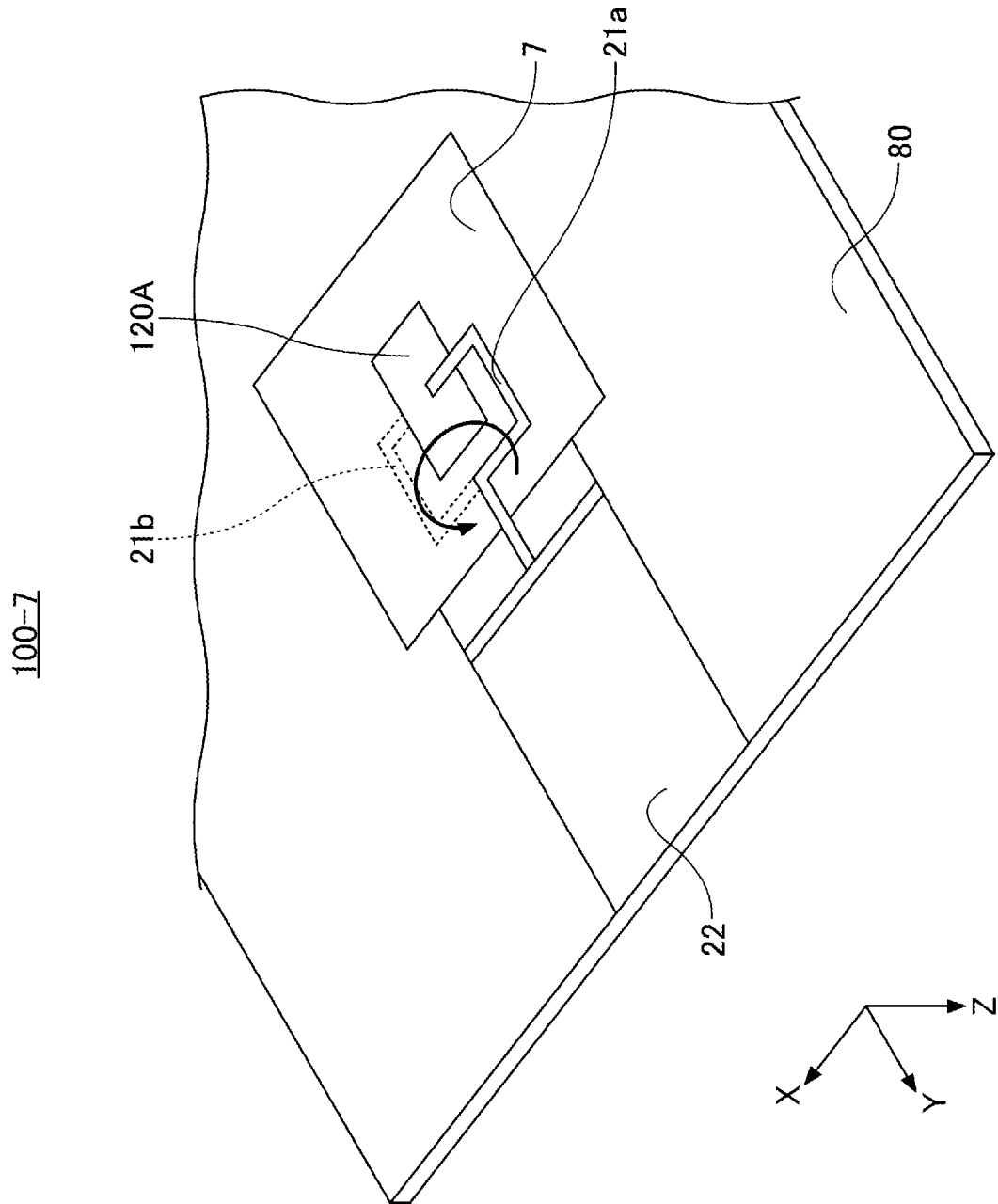

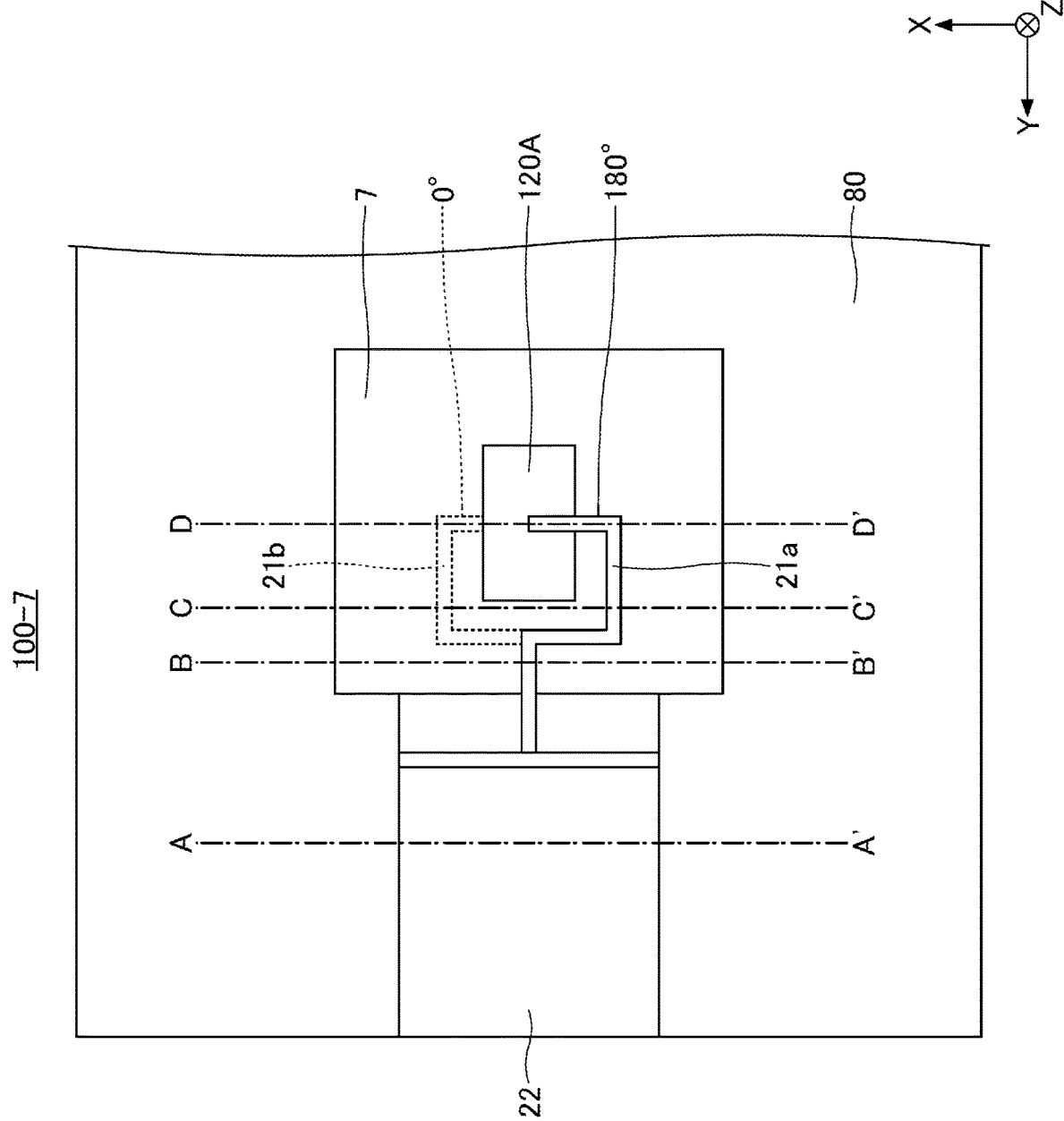

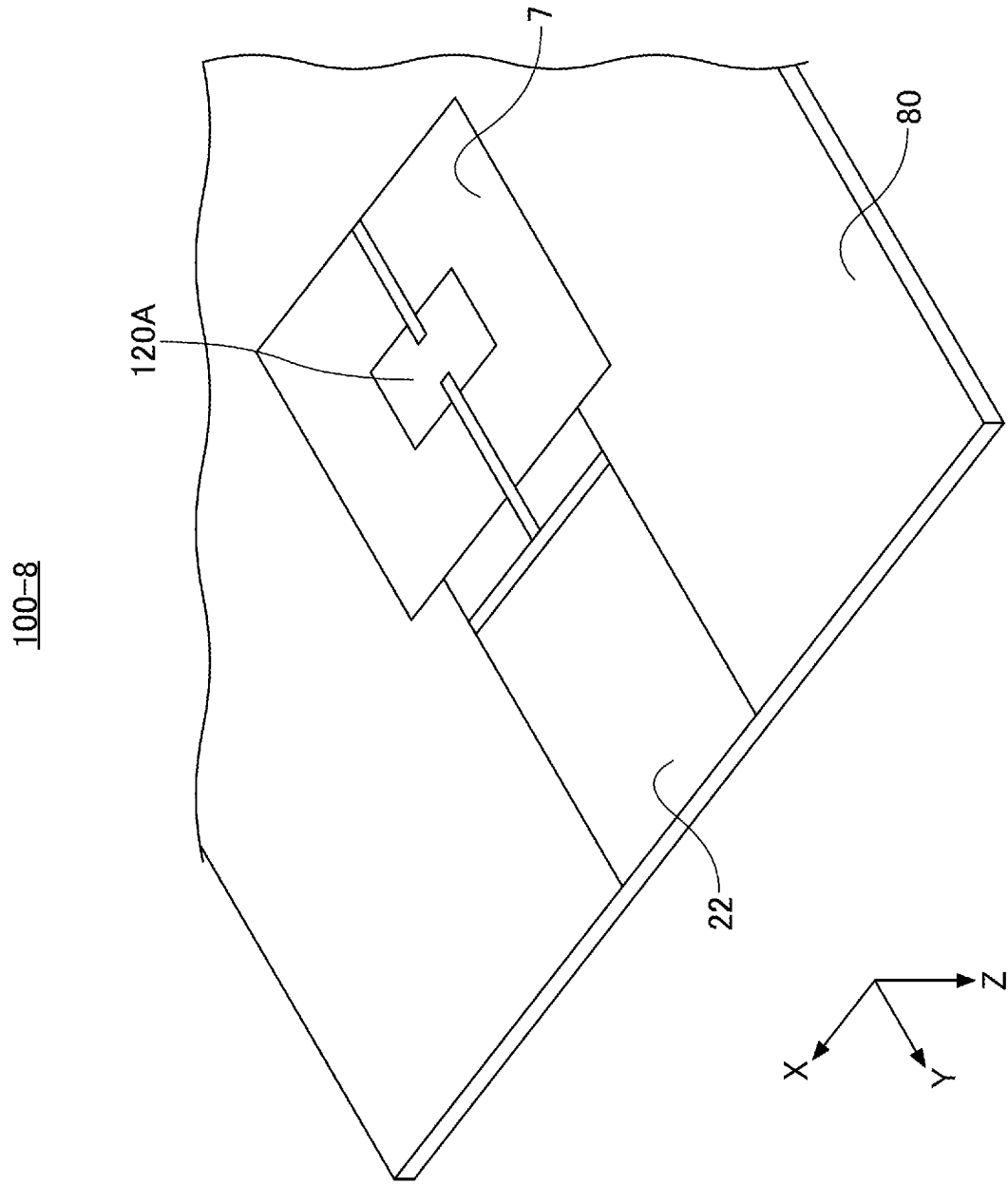

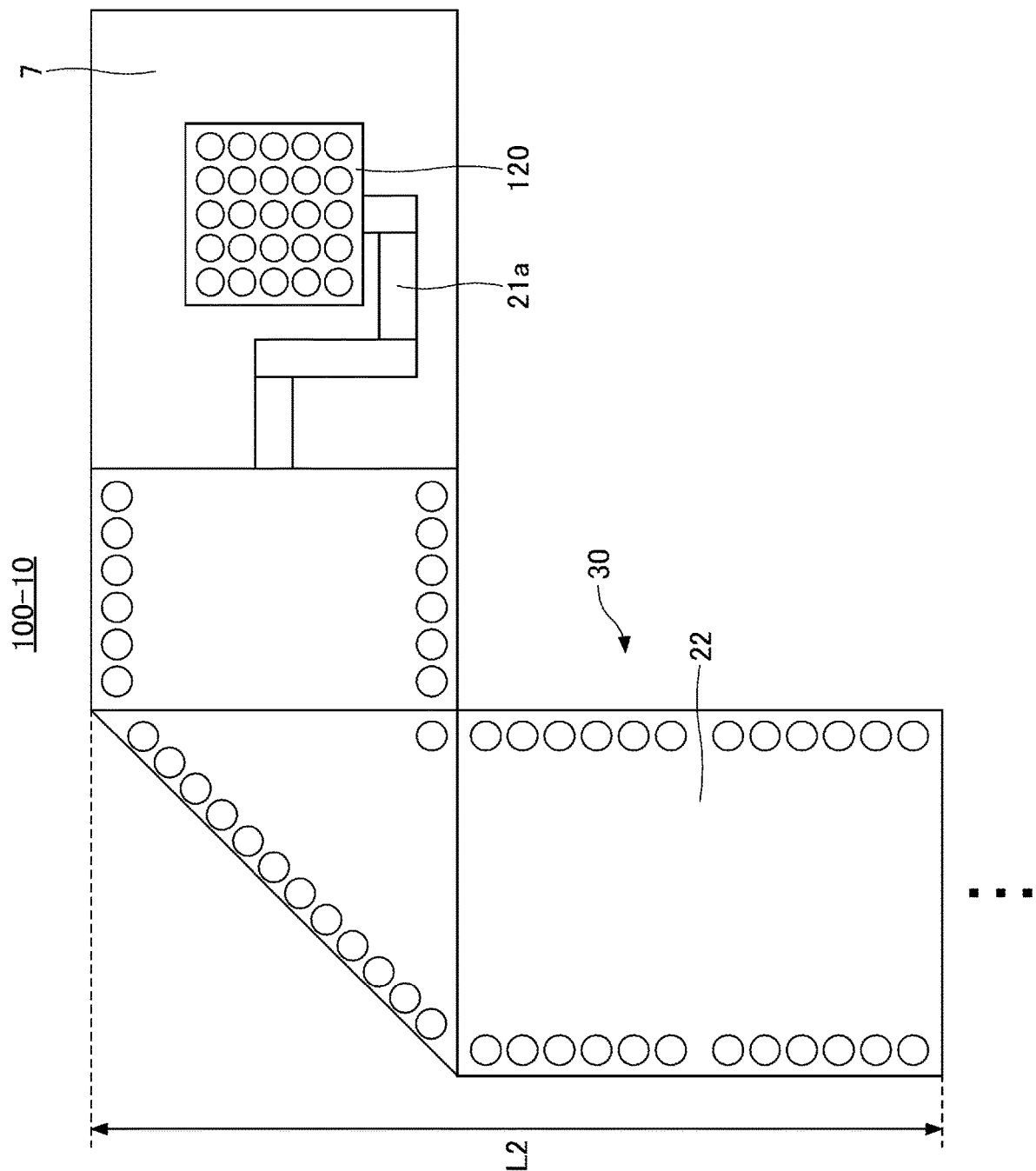

ANTENNA

CROSS-REFERENCE TO RELATED APPLICATION

The present application is a continuation application filed under 35 U.S.C. 111 (a) claiming benefit under 35 U.S.C. 120 and 365 (c) of PCT International Application No. PCT/JP2020/022925 filed on Jun. 10, 2020 and designating the U.S., which claims priority to Japanese Patent Application No. 2019-109115 filed on Jun. 11, 2019. The entirety of the foregoing applications is incorporated herein by reference.

BACKGROUND OF THE INVENTION

1. Field of the Invention

The present invention relates to an antenna.

2. Description of the Related Art

It is known that robots, automobiles, trains, and the like are equipped with antennas that transmit and receive various electromagnetic waves. A vehicular planar antenna device disclosed in PTL includes an antenna substrate, a radome protecting a surface of the antenna substrate, a bracket for fixing the antenna substrate to a chassis of a vehicle, and a feeding cable for feeding power to the antenna substrate. A ground conductor facing the bracket, a plate-shaped dielectric, and a radiating element are stacked in this order, so that the antenna substrate is provided on the chassis of the vehicle.

CITATION LIST

Patent Literature

PTL 1: Japanese Laid-Open Utility Model Publication No. H5-55607

SUMMARY OF THE INVENTION

However, the conventional technique as disclosed in PTL 1 has a problem in that, in a case where a substrate of which the plate thickness is thin, such as a flexible substrate, is used, the thickness of the dielectric decreases, because the distance from the radiating element to the ground conductor relatively becomes shorter, which makes it difficult to secure the required antenna performance.

Accordingly, the present disclosure provides an antenna capable of securing the required antenna performance.

Solution to Problem

The present disclosure provides an antenna including an antenna conductor to be provided on an exterior side of a chassis and a flexible substrate including a first insulating portion that is a portion of a sheet-shaped dielectric where the sheet-shaped dielectric is folded, a grounding conductor provided between the first insulating portion and the chassis, a second insulating portion that is a portion of the sheet-shaped dielectric where the sheet-shaped dielectric is not folded, and a signal line configured to feed power to the antenna conductor, wherein a thickness of the first insulating portion is greater than a thickness of the second insulating portion.

Advantageous Effects of Invention

According to a technique of the present disclosure, an antenna capable of securing the required antenna performance can be provided.

BRIEF DESCRIPTION OF THE DRAWINGS

FIG. 1 is an external view illustrating a vehicle 1 having an antenna 100 according to an embodiment of the present invention.

FIG. 2 is a first cross-sectional view of an antenna 100-1 according to a first configuration example.

FIG. 3 is a second cross-sectional view of the antenna 100-1 according to the first configuration example.

FIG. 4 is a cross-sectional view of an antenna 100-2 according to a second configuration example.

FIG. 5B is a plan view in an XY plane illustrating a folded portion of the antenna 100-3 according to the third configuration example.

FIG. 6 is a plan view illustrating an antenna 100-4 according to a fourth configuration example.

FIG. 10A is a perspective view of an antenna 100-7 according to a seventh configuration example.

FIG. 10B is a plan view illustrating the antenna 100-7 according to the seventh configuration example.

FIG. 13A is a perspective view of an antenna 100-8 according to an eighth configuration example.

FIG. 17C is a drawing illustrating a configuration example of the flexible substrate 30 used for the antenna 100-10.

DETAILED DESCRIPTION OF THE PREFERRED EMBODIMENTS

Figure 5A:
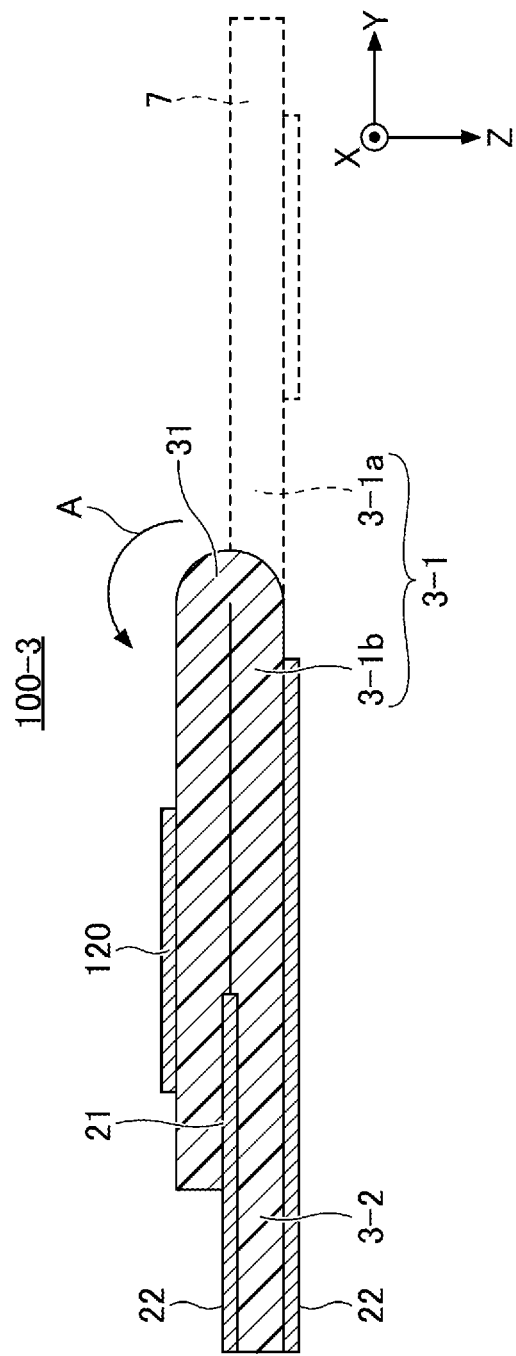
FIG. 5A is a cross-sectional view of an antenna 100-3 according to a third configuration example.

Hereinafter, an embodiment according to the present disclosure will be described with reference to the drawings. Deviations from directions such as a parallel direction, a perpendicular direction, a horizontal direction, a vertical direction, an upward-downward direction, and a left-right direction are tolerated to an extent that the effects of the present invention are not impaired. Also, an X axis direction, a Y axis direction, and a Z axis direction represent a direction parallel to the X axis, a direction parallel to the Y axis, and a direction parallel to the Z axis, respectively. The X axis direction, the Y axis direction, and the Z axis direction are perpendicular to each other. An XY plane, a YZ plane, and a ZX plane represent an imaginary plane parallel to the X axis direction and the Y axis direction, an imaginary plane parallel to the Y axis direction and the Z axis direction, an imaginary plane parallel to the Z axis direction and the X axis direction, respectively.

An antenna according to an embodiment of the present disclosure is suitable for transmitting and receiving electromagnetic waves of radio frequency bands such as microwaves and millimeter waves (for example, over 1 GHz to 300 GHz). The antenna according to the embodiment of the present disclosure can be applied to, for example, a V2X communication system, a fifth generation mobile communication system (what is termed as "5G"), an automotive radar system, and the like, but is not limited thereto. For example, the antenna may be for frequency bands such as, for example, Intelligent Transport Systems (ITS) (5.89 GHz), 5G (28 GHz band, 3.6 to 6 GHz band, and 39 GHz band), Wi-Fi (2.4 GHz and 5 GHz), and the like.

FIG. 1 is an external view illustrating a vehicle 1 including an antenna 100 according to the embodiment of the present invention. The vehicle 1 is, for example, a front railroad car of a train, a rear railroad car of the train, railroad cars other than the front and the rear railroad cars of the train. The antenna 100 is provided on a chassis 1a of the vehicle 1. Also, the antenna 100 according to the embodiment can be used not only for trains but also for automobiles, buildings, robots, aircraft, and the like. The chassis 1a is not limited to a panel that constitutes the exterior contour of the vehicle 1, and may be, for example, at any location where an antenna conductor 120, described later, can be provided. For example, the chassis 1a includes: windshields of automobiles; rear window glass of automobiles; linings of automobiles, aircraft, and automobile; window glass of buildings, frames that constitute the exterior contours of robots, and the like.

In a case where the chassis 1a is window glass of a building, for example, the antenna conductor 120, described later, is provided on the interior-side of the window glass of the building, and an RF module 60, described later, is provided behind the ceiling of a room of the building. In addition, an antenna conductor 120 and a feeding circuit 110, described later, are integrally provided on a flexible substrate 30, described later, and the antenna conductor 120 is connected to the RF module 60 through the feeding circuit 110.

In a case where the chassis 1a is a windshield of an automobile, the antenna conductor 120 is sandwiched in the inside of the windshield or is provided on a surface of the windshield. The RF module 60 is provided on an attachment portion of a windshield rearview mirror of an automobile, the antenna conductor 120 and the feeding circuit 110, described later, are integrally provided on the flexible substrate 30, and the antenna conductor 120 is connected to the RF module 60 through the feeding circuit 110.

In a case where the chassis 1a is the body of a robot, the antenna conductor 120 is provided on a surface (an exterior side) of the body of the robot, and the RF module 60 is provided on an interior side of the body of the robot. The antenna conductor 120 and the feeding circuit 110, described later, are integrally provided on the flexible substrate 30, and the antenna conductor 120 is connected to the RF module 60 through the feeding circuit 110.

FIG. 2 is a first cross-sectional view of an antenna 100-1 according to a first configuration example. FIG. 3 is a second cross-sectional view of the antenna 100-1 according to the first configuration example. FIG. 2 is a cross-section taken along line II-II of FIG. 1. FIG. 3 is a cross-section taken along line III-III of FIG. 2. The antenna 100-1 includes a feeding circuit 110-1, an antenna conductor 120, an RF connector 50, and an RF module 60.

The feeding circuit 110-1 includes the flexible substrate 30 provided to extend from an exterior-side surface 1a1 of the chassis 1a to an interior-side surface 1a2 of the chassis 1a; and a transmission line 20 provided on the flexible substrate 30 to be connected to the antenna conductor 120, the transmission line 20 having a shield structure for confining electromagnetic waves. In addition, the feeding circuit 110-1 may further include a design portion 40 provided on an opposite side of the transmission line 20 from the chassis 1a (i.e., an exterior side of the chassis 1a) so as to cover at least a portion of the transmission line 20.

The flexible substrate 30 is a single-layer double-sided substrate that has such a flexibility such that the flexible substrate 30 can be bent along the curved surface portion of the chassis 1a and can be deformed repeatedly by a weak force, the single-layer double-sided substrate having a property of maintaining its electrical characteristics even when deformed.

The flexible substrate 30 is, for example, of a structure in which conductor foils with a thickness of 12 μm to 300 μm are pasted to the upper and lower surfaces of a dielectric 7 (a base film) in a thin film shape with a thickness of 12 μm to 300 μm. The dielectric 7 in the thin film shape constitutes a first insulating portion 3-1 and a second insulating portion 3-2. The dielectric 7 is a material that is referred to as a solder resist (a resist or a photoresist) or a coverlay, and is made with polyimide, polyester, or the like. For the conductor foil, for example, gold, silver, copper, aluminum, platinum, chrome, or the like is used. The flexible substrate 30 is thinner and has better workability than a typical rigid substrate (a total thickness of 300 μm to 1,600 μm) and accordingly, the flexible substrate 30 can be processed into a complex shape.

The dielectric 7 of the flexible substrate 30 is preferably a transparent dielectric member that transmits visible light. The term "transparent" includes semitransparent. When the dielectric 7 is transparent, and the conductors (the antenna conductor 120, a signal line 21, and a grounding conductor 22) are made into a fine mesh shape, transparency can be substantially achieved in a visible light region, so that the chassis 1a can be seen even if covering is not provided by the design portion 40. In order to alleviate blocking of the view through the flexible substrate 30, the visible light transmittance of the dielectric 7 of the flexible substrate 30 is, for example, preferably 30% or more, more preferably 40% or more, still more preferably 50% or more, still yet more preferably 60% or more, and particularly more preferably 80% or more. Although the upper limit is not particularly limited, the upper limit may be 99% or less and may be 95% or less. In this case, the visible light transmittance is a value obtained by multiplying the values of the spectral transmittances measured by a spectrophotometer by weighting coefficients defined by the Japanese Industrial Standards (JIS R3106(1998)) and averaging the values to derive a weighted average.

For example, the dielectric 7 of the flexible substrate 30 has a loss tangent (what is termed as tan δ) of 0.01 or less at 28 GHz. The loss tangent at 28 GHz is an example of an index at a frequency in a gigahertz band. Therefore, when the loss tangent at 28 GHz is 0.01 or less, for example, the transmission loss of the transmission line 20 is alleviated even in 1 GHz to 100 GHz, and therefore, the antenna gain of the antenna 100-1 can be improved in 1 GHz to 100 GHz, and not only at around 28 GHz. In order to alleviate the transmission loss of the transmission line 20 (and also to alleviate the reduction in the antenna gain), the dielectric 7 of the flexible substrate 30 is preferably 0.005 or less, more preferably 0.004 or less, still more preferably 0.003 or less, still yet more preferably 0.002 or less, and particularly more preferably 0.001 or less. The loss tangent of the dielectric 7 of the flexible substrate 30 at 28 GHz may be more than 0, and for example, it may be 0.00001 or more, may be 0.0005 or more, and may be 0.001 or more.

The loss tangent (tan δ) is a value measured using a cavity resonator and a vector network analyzer by the method specified in Japanese Industrial Standards (JIS R 1641: 2007) at 25° C., 28 GHz.

On the exterior-side surface 1a1 of the chassis 1a, the flexible substrate 30 extends from a flat portion 10 to a bent portion 11 of the chassis 1a, and is folded at an end portion of the bent portion 11 to extend toward the interior-side surface 1a2 of the chassis 1a. Therefore, the flexible substrate 30 preferably has a flexibility such that the flexible substrate 30 can sufficiently withstand being folded from the front surface to the back surface of the chassis 1a of which the thickness is about 2 mm. An RF connector 50 is connected to the flexible substrate 30 extended to the interior-side surface 1a2 of the chassis 1a. The RF connector 50 is connected to, for example, an RF module 60 provided on the interior-side surface 1a2 of the chassis 1a. The RF connector 50 and the RF module 60 are provided on the interior-side of the chassis 1a, so that the RF connector 50 and the RF module 60 are covered by the chassis 1a, which improves the design of the antenna 100-1.

The flexible substrate 30 is provided along the curved surface of the chassis 1a, so that the transmission line 20 can be structured in parallel to the portion of the chassis 1a of which the curvature varies, even with the chassis 1a having the curved surface. Therefore, the degree of freedom in designing the antenna 100-1 is improved, and the transmission line 20 does not appear to rise from the chassis 1a, which improves the design. Alternatively, the flexible substrate 30 may be provided on a chassis 1a that does not have a curved surface. Even in a case where the flexible substrate 30 is provided on a chassis 1a that does not have a curved surface, the flexible substrate 30 can be provided such that the flexible substrate 30 is folded from the exterior-side surface 1a1 to the interior-side surface 1a2 of the chassis 1a, which facilitates connection to the RF module 60 provided on the interior-side surface 1a2 of the chassis 1a, and therefore, the design is improved and also the degree of freedom in designing the antenna 100-1 is improved.

The antenna conductor 120 is provided, for example, on a folded portion 31 of the flexible substrate 30. The folded portion 31 of the flexible substrate 30 is a portion of which the thickness in the Z axis direction is increased by folding the end portion of the dielectric 7 of the flexible substrate 30 in a sheet shape. The antenna conductor 120 is provided on the exterior-side of the chassis 1a via the folded portion 31 of the flexible substrate 30.

In the form as illustrated in FIG. 2, the surface of the antenna conductor 120 is a conductor pattern parallel to the XY plane. The antenna conductor 120 may be a conductor pattern formed on the flexible substrate 30, or may be a conductor sheet, a conductor substrate, or the like provided in advance on the flexible substrate 30 after the antenna conductor 120 is manufactured. For the antenna conductor 120, for example, gold, silver, copper, aluminum, platinum, chromium, or the like is used.

The folded portion 31 of the flexible substrate 30 is equivalent to an area (a first insulating portion 3-1) of the dielectric 7 that is located between the grounding conductor 22 and the antenna conductor 120, which are arranged in the Z axis direction.

A portion other than the folded portion 31 of the flexible substrate 30 is equivalent to an area (a second insulating portion 3-2) of the dielectric 7 that is not located between the antenna conductor 120 and the chassis 1a. The second insulating portion 3-2 corresponds to, for example, a portion that extends from a border portion between the folded portion 31 of the flexible substrate 30 and the signal line 21 to the end portion of the flexible substrate 30 located on the interior-side of the chassis 1a.

The thickness t1 of the first insulating portion 3-1 in the Z axis direction is greater than the thickness t2 of the second insulating portion 3-2 in the Z axis direction. The thickness t2 is set to, for example, a value of 12 μm to 300 μm, and the thickness t1 is preferably greater than the thickness t2, for example, by 12 μm to 300 μm.

By providing the folded portion 31 in the flexible substrate 30, the distance (separation distance) from the grounding conductor 22 to the antenna conductor 120 in the Z axis direction can be increased. Therefore, the gain of the antenna conductor 120 can be improved, and the structure of the antenna 100-1 is simplified to improve the reliability.

The transmission line 20 in FIG. 3 is preferably, for example, a substrate integrated waveguide (SIW) that is provided along the surface of the chassis 1a and that has a shield structure for confining electromagnetic waves. The SIW may also be referred to as a substrate-embedded waveguide or a post-wall waveguide. As illustrated in FIG. 3, the SIW is a waveguide that is constituted by the dielectric 7 of the flexible substrate 30, two conductor layers (described later), and multiple conductor posts 23, and that transmits signals in a waveguide mode. The two conductor layers are a conductor pattern (the grounding conductor 22) formed on the dielectric 7 of the flexible substrate 30. The conductor posts 23 are solid or hollow columnar conductors that electrically connect the two conductor layers. The conductor posts 23 are arranged at such intervals that radio frequency signals propagating in the SIW do not leak to the outside.

For the grounding conductor 22, for example, gold, silver, copper, aluminum, platinum, chromium, or the like is used. The thickness of the grounding conductor 22 is preferably 0.09 μm or more, and more preferably 0.35 μm or more. The thickness of the grounding conductor 22 is preferably 110 μm or less. When the thickness of the grounding conductor 22 is within the above-described range, the antenna gain of the antenna conductor 120 can be improved.

The signal line 21 as illustrated in FIG. 2 is a conductor pattern connected to the dielectric 7. An end of the signal line 21 (i.e., an end portion on the positive Y axis direction) is provided in an area between the antenna conductor 120 and the grounding conductor 22 (i.e., a portion of the folded portion 31 where the dielectric 7 in the sheet shape overlaps on top of itself). The signal line 21 is, for example, electrically connected to the antenna conductor 120 in a non-contact manner. For the signal line 21, for example, gold, silver, copper, aluminum, platinum, chromium, or the like is used. The thickness of the signal line 21 is preferably 0.09 μm or more, and is more preferably 0.35 μm or more. The thickness of the signal line 21 is preferably 110 μm or less.

The transmission line 20 may be a transmission line other than SIW. Other examples of the transmission line 20 include a strip line, a microstrip line, and the like having flexibility.

The design portion 40 serves as a mask for covering the antenna conductor 120 and the transmission line 20. In this configuration example, an end portion 41 of the design portion 40 on the positive Y axis direction side is in contact with, for example, the portion of the exterior-side surface 1a1 of the chassis 1a at the vicinity of an end portion of the folded portion 31 of the flexible substrate 30 on the positive Y axis direction. An end portion 42 on an opposite side from the end portion 41 of the design portion 40 extends to, for example, the vicinity of an end portion of the bent portion 11 of the chassis 1a.

Of the entirety of the transmission line 20, a portion extending from a folded portion 20a to the interior side of the chassis 1a is not provided with the design portion 40. This is because this portion is less likely to be seen when the chassis 1a is seen in a plan view from the positive Z axis direction. According to this configuration, the design of the antenna conductor 120 and the transmission line 20 can be improved even when this portion is not covered by the design portion 40. In addition, the area where the design portion 40 is provided can be reduced, so that an increase in the manufacturing cost of the antenna 100-1 can be alleviated.

Although the design portion 40 covers both of the antenna conductor 120 and the transmission line 20 in this configuration example, the design portion 40 may have such a shape as to cover at least a portion of the transmission line 20. A portion of the transmission line 20 is, for example, an area from the border portion between the folded portion 31 of the flexible substrate 30 and the signal line 21 to the folded portion 20a of the transmission line 20 (the vicinity of the end portion of the bent portion 11 of the chassis 1a). According to this configuration, a portion of the transmission line 20 is covered by the design portion 40, which can alleviate worsening of the appearance of the chassis 1a.

The design portion 40 is, for example, a sheet member, a paint film, or the like that is constituted by a material having a flexibility such that the design portion 40 can be bent along the curved surface of the chassis, and having a property of transmitting electromagnetic waves, waterproofness, impact resistance, and the like.

In a case where the design portion 40 is a sheet member, the design portion includes: a transparent resin layer provided on the front surface, i.e., on an opposite side from the transmission line 20; and a base material layer provided on the back surface (i.e., a surface on the side of the transmission line 20). The transparent resin layer is made of acrylic resin with excellent durability and high transparency. The base material layer is made of acrylonitrile-ethylene-styrene resin (AES resin). The base material layer may be a resin other than AES resin, such as, for example, ABS resin, polycarbonate resin, polyvinyl chloride, or the like.

AES resin has the same basic characteristics as ABS resin, and because AES resin has special ethylene propylene rubber as the rubber component, AES resin has better stability against light deterioration and can be used outdoors for a longer period of time than ABS resin. In addition, AES resin has excellent moldability and can be colored as needed.

Therefore, AES resin is a suitable material for the design portion 40 provided in, for example, automobiles, trains, and the like used outdoors.

ABS resin is a versatile resin that is flexible, durable, and workable, and can be colored as needed like AES resin. However, ABS resin has lower weather resistance (a property of an industrial product capable of withstanding outdoor environments such as sunlight, temperature, humidity, and rain), and therefore, ABS resin is a suitable material for the design portion 40 provided in, for example, a chassis of a robot used indoors.

Polycarbonate resin is a plastic that can be colored as needed and has a high degree of transparency, a self-extinguishing property, and impact resistance. In addition, polycarbonate resin has a high degree of weather resistance, and therefore, polycarbonate resin is a suitable material for the design portion 40 provided in, for example, automobiles, trains, and the like used outdoors.

Polyvinyl chloride is inexpensive and has excellent workability, and in addition, it has an insulating property. Therefore, polyvinyl chloride is suitable as a material for manufacturing, at a low cost, the design portion 40 in such a shape as to cover a portion of the transmission line 20.

In a case where the design portion 40 is a coating film, for example, a paint having a property of transmitting electromagnetic waves is used. The paint is not particularly limited, and examples of paints include acrylic paints, urethane paints, epoxy paints, and polyester paints. The coating method is not particularly limited, and examples thereof include air spray coating, airless spray coating, dip coating, shower coating, and roll coating.

In a case where the design portion 40 is a member in a sheet shape, the antenna 100-1 is completed simply by pasting the design portion 40 manufactured in advance onto the transmission line 20 and the like, so that the assembly time of the antenna 100-1 can be shortened, and mass production can be achieved. In addition, in the case of the design portion 40 in the sheet shape, even when there is generated a step portion at the border portion between the folded portion 31 of the flexible substrate 30 and the signal line 21 or at the border portion between the folded portion 31 of the flexible substrate 30 and the chassis 1a, the design portion 40 in the sheet shape can make the step portion less noticeable. Therefore, the design can be improved. In addition, in the case of the design portion 40 in the sheet shape, the design portion 40 can be readily removed, so that the maintenability of the antenna conductor 120, the transmission line 20, and the like is improved.

In a case where the design portion 40 is a member in a sheet shape, the design portion 40 may be fixed to the chassis 1a so that at least a portion of the flexible substrate 30 is covered by the design portion 40 in the sheet shape. According to this configuration, even if the step of fixing the flexible substrate 30 to the chassis 1a by adhesion or the like is omitted, the flexible substrate 30 can be fixed to the chassis 1a. Therefore, the task of applying an adhesive or the like to bond the flexible substrate 30 to the chassis 1a can be omitted, and the manufacturing time of the antenna 100-1 can be reduced.

In a case where the design portion 40 is a coating film, a high adhesion property with the antenna conductor 120 and the transmission line 20 can be obtained. Furthermore, the coating film can be formed regardless of the shape of the transmission line 20 and the flexible substrate 30, and therefore, the degree of freedom in designing the antenna 100-1 is improved.

The color of the design portion 40 is preferably, substantially the same color as the color of the chassis 1a. In this configuration example, substantially the same color means a color difference that is almost visually indistinguishable, and means a color difference LE of 3 or less and preferably a color difference LE of 1.5 or less, in L*a*b values of the L*a*b* display system measured with a spectrophotometer. The color difference LE means a maximum color difference between color arrangements of patterns.

$$\Delta E = \{(L1-L2)^2 + (a1-a2)^2 + (b1-b2)^2\}^{0.5}$$

L1, a1, b1: color measuring result of the chassis 1a

L2, a2, b2: color measuring result of the design portion 40

When the color of the design portion 40 is configured to be almost the same as the color of the chassis 1a, more specifically, for example, when the design portion 40 in white is bonded to the chassis 1a in white, the respective colors in practice can be deemed as the same color even if the respective colors are different from each other in a strict sense. Therefore, the design of the antenna 100-1 is more greatly improved.

The RF connector 50 is a connector for passing radio frequency signals and for making connection with another substrate or another line. In general, there is a connector constituted by a coaxial line. The RF module 60 is a component in which devices including various functions are implemented. In general, there is a component in which devices such as amplifiers, phasers, mixers, signal sources, filters, switches, circulators, analog-to-digital (AD) and digital-to-analog (DA) converters, and the like are implemented, and which is provided with an RF connector as an input and output interface, a power source, and a control connector.

FIG. 4 is a cross-sectional view of an antenna 100-2 according to a second configuration example. Explanation about the configurations and effects similar to the above-described antenna is omitted or abbreviated by incorporating the above explanation by reference. The antenna 100-2 as illustrated in FIG. 4 includes a feeding circuit 110-2, and the feeding circuit 110-2 includes an insulating member 70 in addition to the configuration as illustrated in FIG. 2.

The insulating member 70 is provided between the design portion 40 and the flexible substrate 30. The insulating member 70 is a flexible base material in a plate shape or in a sheet shape of which the main component is a dielectric. For example, in a case where the design portion 40 is constituted by a coating film, it is difficult to control physical values (a relative permittivity and a loss tangent) of the material in the coating film, and accordingly, the loss tangent tends to decrease. When the insulating member 70 is provided, the distance from the design portion 40 to the dielectric of the flexible substrate 30 can be increased, and the decrease in the antenna gain due to the coating film can be alleviated. The thickness of the insulating member 70 is desirably equal to or more than half of the distance between the antenna conductor 120 and the grounding conductor 22 at the flexible substrate 30 or the distance between the signal line 21 and the grounding conductor 22 (i.e., an insulating material thickness of the flexible substrate 30).

FIG. 5A is a cross-sectional view illustrating a folded portion of an antenna 100-3 according to a third configuration example. FIG. 5B is a plan view in an XY plane illustrating a folded portion of the antenna 100-3 according to the third configuration example. Explanation about the configurations and effects similar to the above-described antenna is omitted or abbreviated by incorporating the above explanation by reference.

As illustrated in FIG. 5A, the folded portion 31 is formed by folding the dielectric 7, expanded in a plate-shape indicated by a broken line, in the direction of arrow A. The folded portion 31 is formed by placing a first area 3-1a, in which the antenna conductor 120 is formed, onto a second area 3-1b, in which the signal line 21 is formed. In the antenna 100-3 configured in this manner, the relationship in position between the antenna conductor 120 and an open end portion 21A of the signal line 21 greatly affects the antenna characteristics. Therefore, when the folded portion 31 is formed, in order to set the open end portion 21A of the signal line 21 to the desired position in terms of the antenna characteristics, the position where the dielectric 7 is folded is important.

Accordingly, in addition to the configuration as illustrated in FIG. 2, the antenna 100-3 includes multiple conductor patterns 4 as means for setting the fold-back position of the dielectric 7. Specifically, the multiple conductor patterns 4 are formed on a plate surface, on the negative Z axis direction, of the dielectric 7 extended in the plate shape as illustrated in FIG. 5B. For the conductor pattern 4, for example, gold, silver, copper, aluminum, platinum, chromium, or the like is used. Although four conductor patterns 4 are formed in this configuration, the number of conductor patterns 4 may be equal to or more than four.

For example, of the four conductor patterns 4, a set of two conductor patterns 4 is formed in a portion close to an end portion of the dielectric 7 on the negative X axis direction, and a set of remaining two conductor patterns 4 is formed in a portion close to an end portion of the dielectric 7 on the positive X axis direction. The two conductor patterns 4 in each set are arranged spaced apart at a certain distance in the Y axis direction, so as to form, for example, a gap G of about 0.5 mm to 5.0 mm. This gap G functions as a marking of the fold-back portion. The position of the gap G is set so that the open end portion 21A of the signal line 21 is placed at the desired position in terms of the antenna characteristics when the folded portion 31 is formed.

According to the antenna 100-3, the conductor patterns 4 adjacent to each other are provided, so that the gap G can be set to a fold-back position B that is desired in terms of the antenna characteristics. Therefore, the folded portion 31 can be readily formed by making a crease in the fold-back position B. As a result, the antenna 100-3 with excellent antenna characteristics can be obtained while significantly reducing the manufacturing time.

FIG. 6 is a plan view illustrating an antenna 100-4 according to a fourth configuration example, and corresponds to another aspect of FIG. 5. Explanation about the configurations and effects similar to the above-described antenna is omitted or abbreviated by incorporating the above explanation by reference. The antenna 100-4 is different from the antenna 100-3 in that, in the antenna 100-4, for any given set, the position of one of the conductor patterns 4 is offset in a direction away from the other of the conductor patterns 4 (X axis direction) so that the conductor patterns 4 are apart from each other and so that the conductor patterns 4 do not come into contact with each other when the folded portion 31 is formed.

The amount of shift in position in the X axis direction is such a size that the conductor patterns 4 do not come into contact with each other when the folded portion 31 is formed, and is, for example, about 0.5 mm to 5.0 mm. When the positions of the conductor patterns 4 are shifted in the X axis direction, the conductor patterns 4 can be prevented from overlapping with each other when the folded portion 31 is formed, and the thickness of the dielectric 7 in the Z axis direction can be readily managed.

Figure 7:
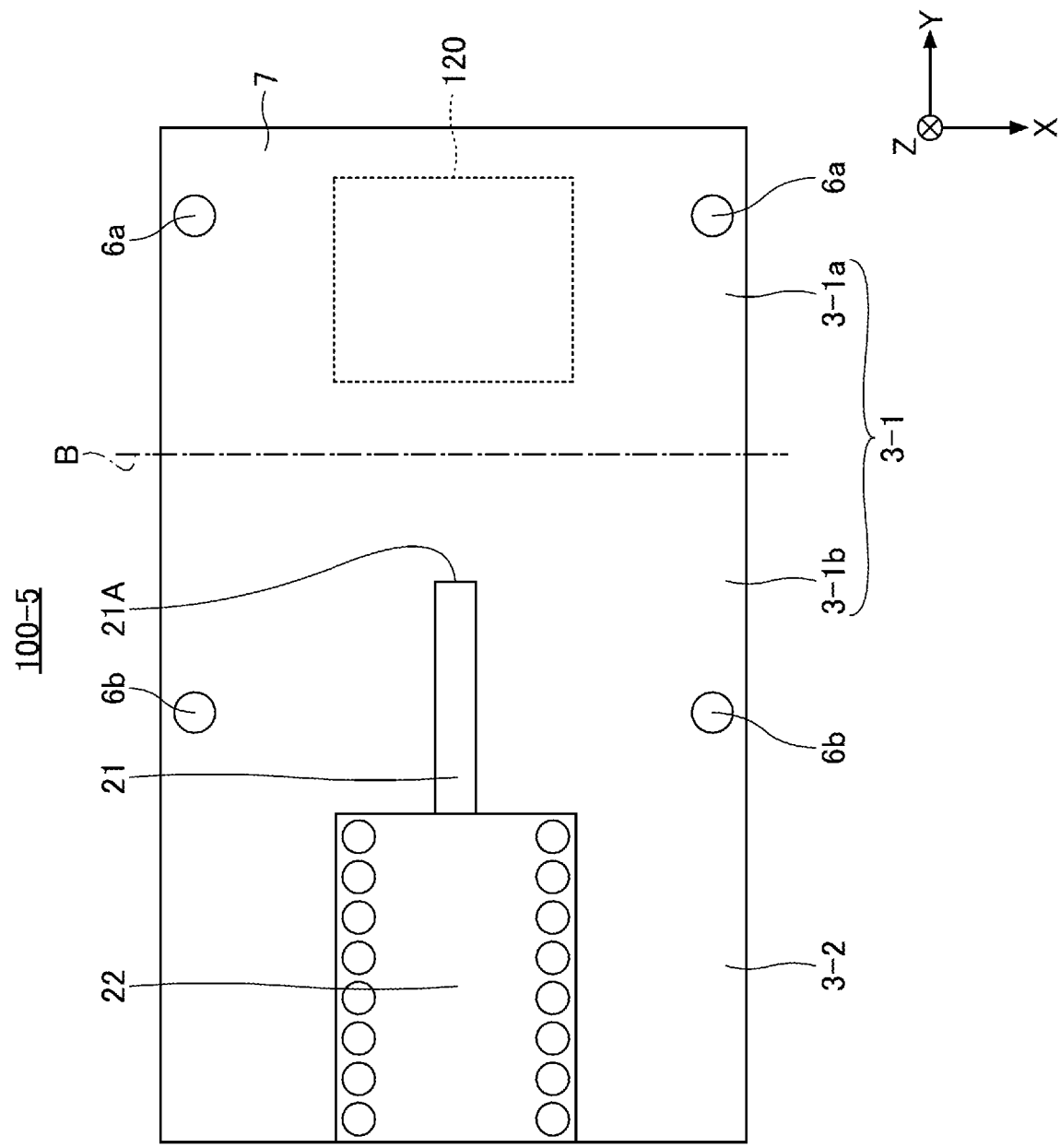
FIG. 7 is a plan view illustrating an antenna 100-5 according to a fifth configuration example.

FIG. 7 is a plan view illustrating an antenna 100-5 according to a fifth configuration example, and corresponds to still another aspect of FIG. 5. Explanation about the configurations and effects similar to the above-described antenna is omitted or abbreviated by incorporating the above explanation by reference. The antenna 100-5 is different from the antenna 100-3 in that, in the antenna 100-5, the multiple conductor patterns 4 are not formed and instead, multiple through holes 6a, 6b are formed in the dielectric 7.

In the first area 3-1a, two through holes 6a are formed, and the two through holes 6a are arranged spaced apart from each other in the X axis direction. In the second area 3-1b, two through holes 6b are formed, and the two through holes 6b are arranged spaced apart from each other in the X axis direction.

The positions of the through holes 6a and the through holes 6b formed in a portion close to an end portion of the dielectric 7 on the negative X axis direction are set so that the open end portion 21A of the signal line 21 is placed at the desired position in terms of the antenna characteristics when the folded portion 31 is formed. The positions of the through holes 6a and the through holes 6b formed in a portion close to an end portion of the dielectric 7 on the positive X axis direction are likewise set. The diameter of each of the through holes 6a, 6b is, for example, about 1.0 mm to 5.0 mm.

In the antenna 100-5, the multiple through holes 6a, 6b arranged spaced apart from each other across the portion where the end portion of the insulating member in the sheet shape (the dielectric 7) is folded (the fold-back position B) are in a linearly symmetrical arrangement about the fold-back position B. According to this configuration, by placing the first area 3-1a onto the second area 3-1b while the through holes 6a and the through holes 6b arranged in the Y axis direction are placed to overlap with each other, a crease can be made at the fold-back position B that is desired in terms of the antenna characteristics. If stick-shaped stoppers are inserted into the through holes 6a and the through holes 6b while the through holes 6a and the through holes 6b are placed to overlap with each other, a misalignment of the first area 3-1a and the second area 3-1b can be prevented.

In addition, according to the antenna 100-5, a crease can be made at an appropriate position with only hole processing, and therefore, the setting of the conductor patterns becomes unnecessary, and the degree of freedom in designing the antenna 100-5 is improved.

Figure 8:
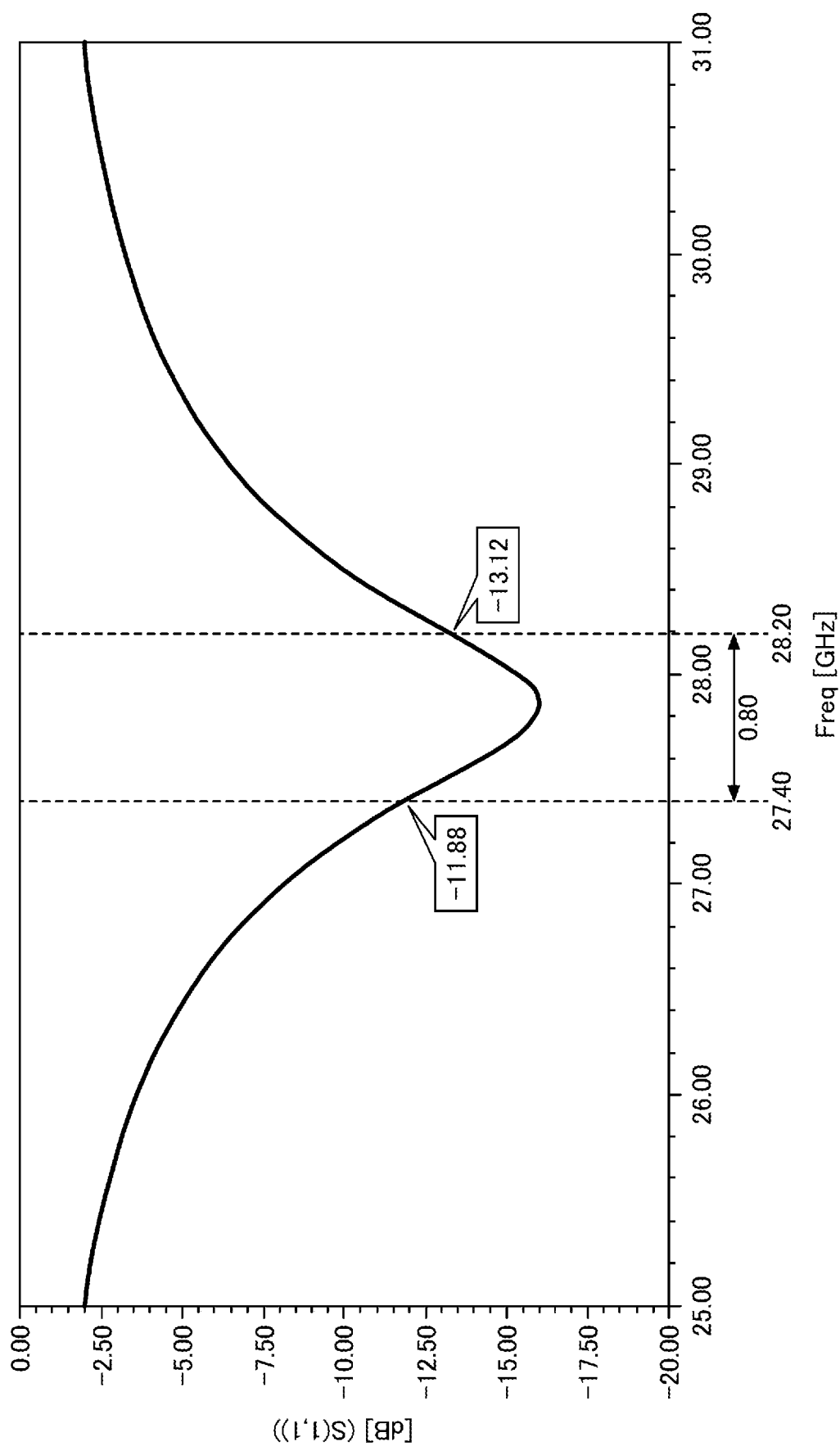
FIG. 8 is a graph illustrating an example of a simulation result of a return loss coefficient S11 of the respective antennas according to the first to fifth configuration examples.

FIG. 8 is a graph illustrating an example of a simulation result of a return loss coefficient S11 of respective antennas according to the first configuration example.

The setting values for the simulation of FIG. 8 are as follows.

The thickness t1 of the first insulating portion 3-1: 400 μm
The thickness t2 of the second insulating portion 3-2: 200 μm (equal to the thickness of the dielectric 7)
The dielectric constant of the dielectric 7: 2.0
The thickness of the grounding conductor 22: 43 μm
The thickness of the signal line 21: 43 μm
The thickness of the antenna conductor 120: 43 μm The simulation of FIG. 8 is a result in such a state that the design portion 40 is omitted. As can be seen from FIG. 8, sufficient return loss characteristics, antenna gain, and radiation efficiency are obtained at around the frequency of 28 GHz. Normally, when the antenna conductor 120 is a microstrip antenna (a patch antenna) that is defined by a width W and a length L, it is common to excite the microstrip antenna at the center of the width W. When the antenna conductor 120 is excited with opposite phases in a case where the microstrip antenna is excited from both sides at the center of the width W, the antenna operates as a microstrip antenna. In each of the antennas of the first configuration example as illustrated in FIG. 8, the SIW is once converted to a parallel plate line, i.e., a balanced line. A signal line conductor on an upper side of the substrate and a signal line conductor on a lower side of the substrate are in a symmetrical arrangement in the YZ place (i.e., a center plane of the signal line conductor that is perpendicular to the horizontal plane of the substrate), and accordingly, the two signal line conductors have the same amplitude and opposite phases (0 degrees and 180 degrees). The two signal line conductors in opposite phases excite the antenna conductor 120 from both sides of the center of the width W of the microstrip antenna, so that the antenna conductor 120 can operate as the microstrip antenna.

Figure 9:
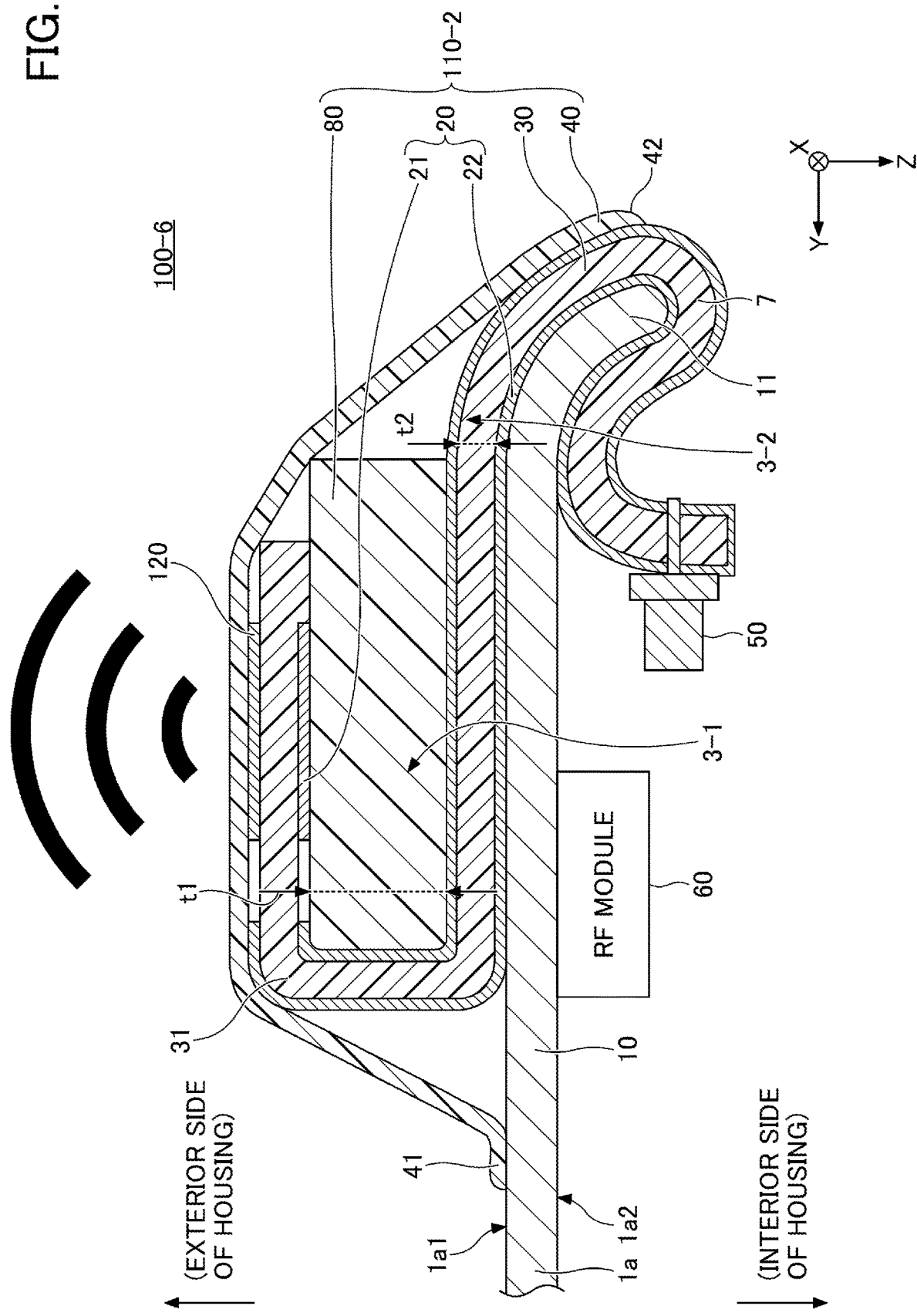
FIG. 9 is a cross-sectional view of an antenna 100-6 according to a sixth configuration example.

FIG. 9 is a cross-sectional view of an antenna 100-6 according to a sixth configuration example. Explanation about the configurations and effects similar to the above-described antenna is omitted or abbreviated by incorporating the above explanation by reference. The antenna 100-6 is different from the antenna 100-1 in that the antenna 100-6 includes, in addition to the configuration as illustrated in FIG. 2, an insulating member 80 provided such that the insulating member 80 is sandwiched in the folded portion 31.

The insulating member 80 is a plate-shaped base material of which the main component is a dielectric, or may be a flexible base material. In a case where the antenna 100 is an antenna for Sub-6, it is necessary to secure the distance from the grounding conductor 22 for the frequency band of Sub 6. Therefore, by providing the insulating member 80, the distance from the grounding conductor 22 to the antenna conductor 120 can be increased, which is preferable in order to alleviate a reduction in the antenna gain. The insulating member 80 has a function of increasing the distance from the antenna conductor 120 to the grounding conductor 22. The insulating member 80 is an example of an insulating spacer.

In a case where the antenna 100-6 is an antenna for Sub-6, it is necessary to secure the distance from the grounding conductor 22 for the frequency band of Sub 6. Therefore, by providing the insulating member 80, the distance from the grounding conductor 22 to the antenna conductor 120 can be increased, which is preferable in order to increase the antenna gain.

Next, a configuration example of a signal line and an antenna conductor of the antenna 100 having the insulating member 80 is explained.

Figure 11A:
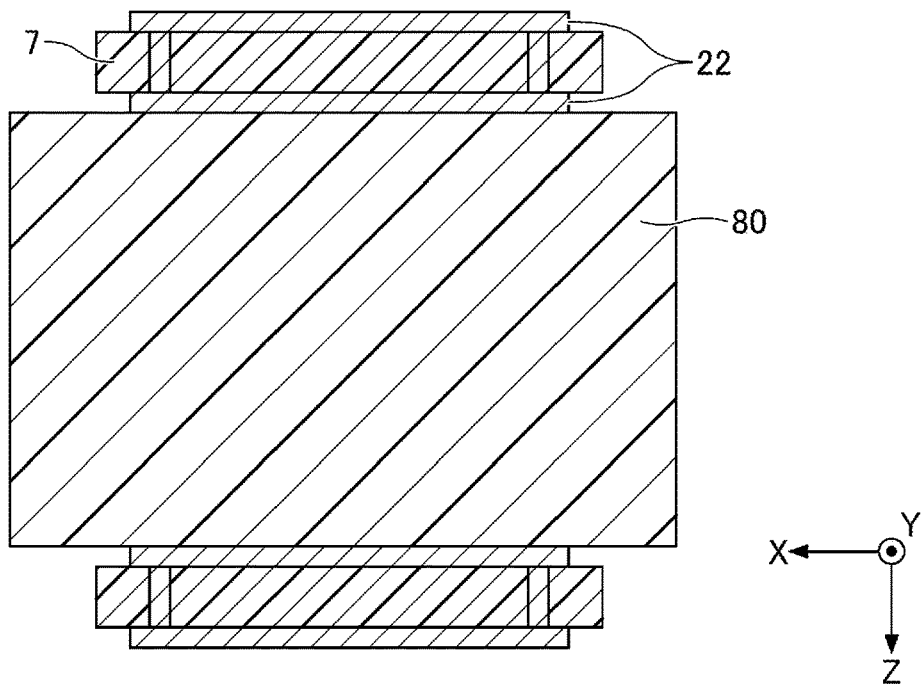
FIG. 11A is a cross-sectional view taken along line A-A' of FIG. 10B.
Figure 11B:
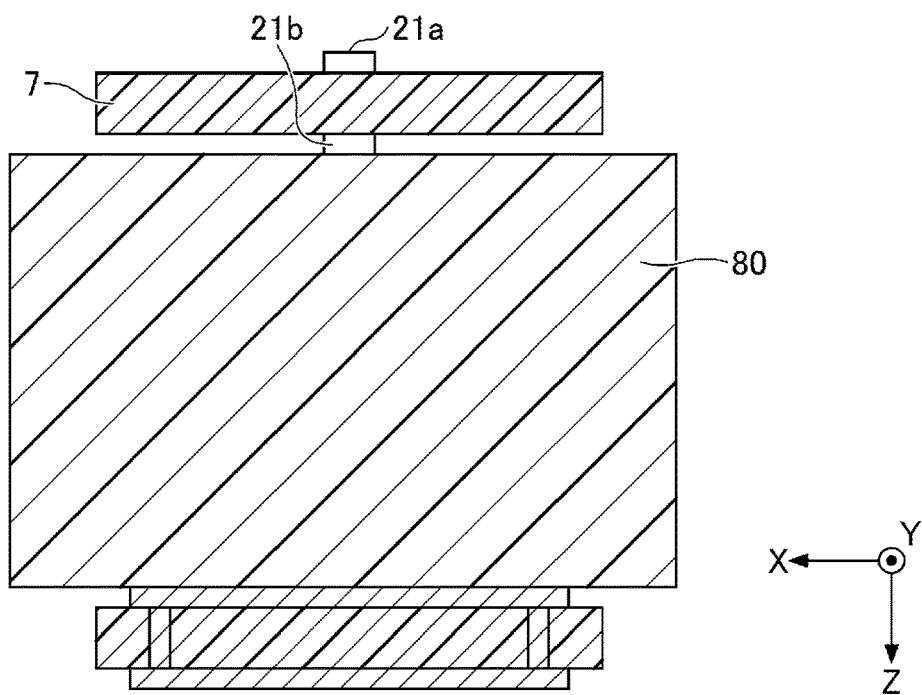
FIG. 11B is a cross-sectional view taken along line B-B' of FIG. 10B.
Figure 11C:
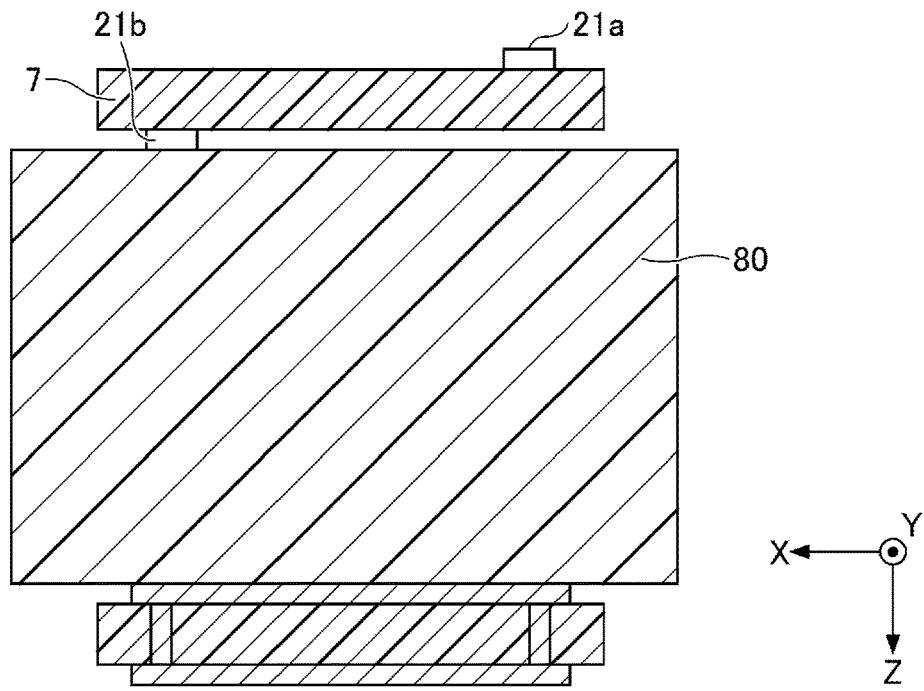
FIG. 11C is a cross-sectional view taken along line C-C' of FIG. 10B.
Figure 11D:
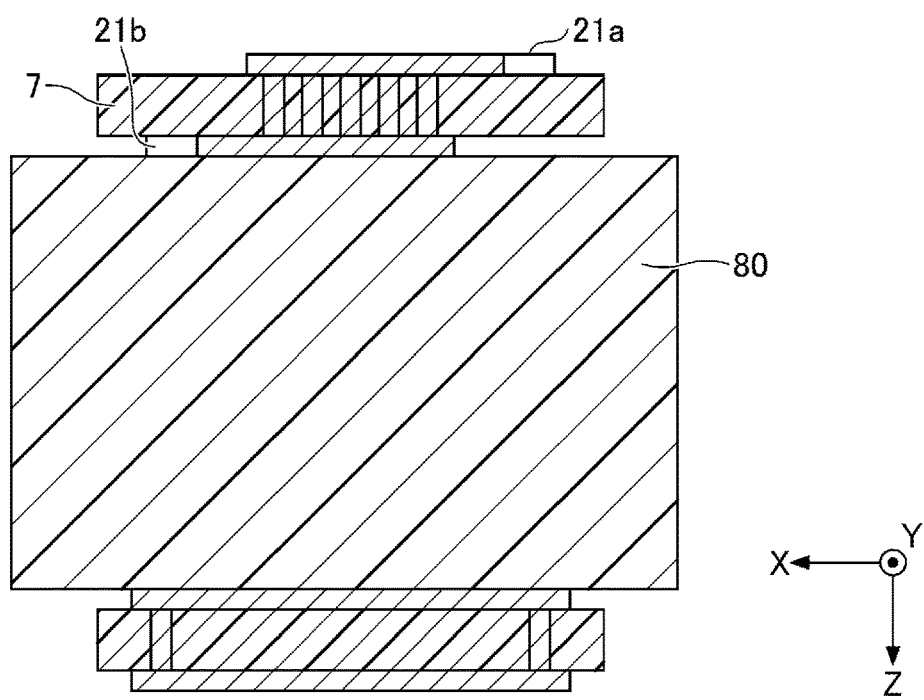
FIG. 11D is a cross-sectional view taken along line D-D' of FIG. 10B.

FIG. 10A is a perspective view of an antenna 100-7 according to a seventh configuration example. FIG. 10B is a plan view illustrating the antenna 100-7 according to the seventh configuration example. FIG. 11A is a cross-sectional view taken along line A-A' of FIG. 10B. FIG. 11B is a cross-sectional view taken along line B-B' of FIG. 10B. FIG. 11C is a cross-sectional view taken along line C-C' of FIG. 10B. FIG. 11D is a cross-sectional view taken along line D-D' of FIG. 10B. In the antenna 100-7, a patch antenna (an antenna conductor 120A) is provided with signal lines 21a and 21b.

The signal line 21a is provided on a plate surface of the dielectric 7 on the negative Z axis direction. The signal line 21a extends a certain distance toward the negative Y axis direction from the grounding conductor 22 toward the antenna conductor 120A, and then, the signal line 21a is folded in a U shape or in a C shape.

The signal line 21b is provided on a plate surface of the dielectric 7 on the positive Z axis direction. The signal line 21b extends a certain distance from the grounding conductor 22 toward the antenna conductor 120A in the negative Y axis direction, and then, the signal line 21b is folded in a linearly symmetrical arrangement about the center line of the antenna conductor 120A with respect to the signal line 21a. The center line of the antenna conductor 120A is, for example, a virtual line that passes through the center of the antenna conductor 120A in the X axis direction and that is parallel to the Y axis direction.

When the signal lines 21a and 21b formed in this manner are connected through vias, the signal lines 21a and 21b constitute a loop antenna. The antenna conductor 120A, i.e., a patch antenna, is provided at the center portion of the loop antenna. A parallel plate transmission line is constituted by the signal lines 21a and 21b. With the parallel plate transmission line, the antenna 100-7 is excited with phases of 0 degrees and 180 degrees at the feeding point.

Figure 12:
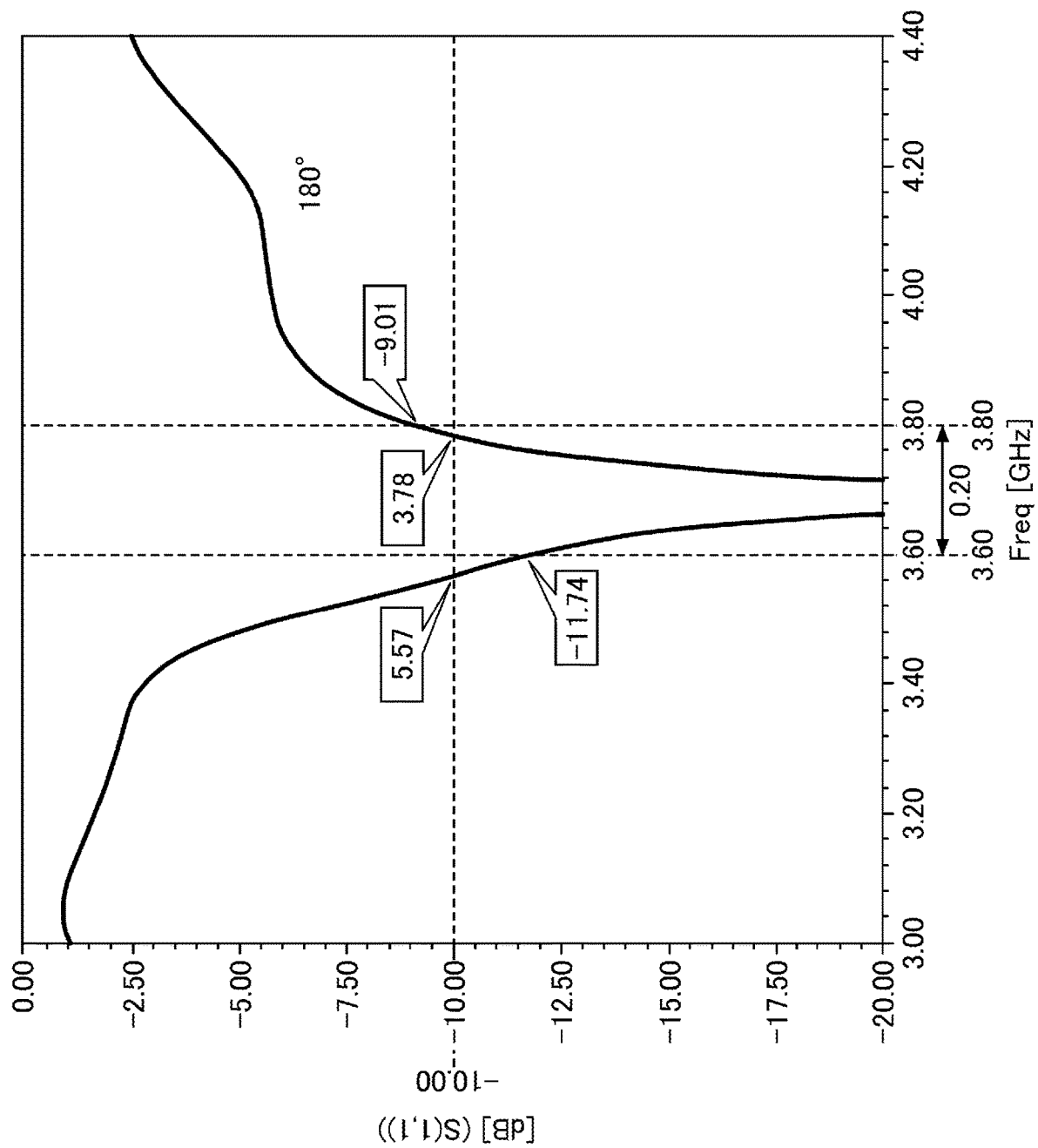
FIG. 12 is a graph illustrating an example of a simulation result of a return loss coefficient S11 of the antenna 100-7 according to the seventh configuration example.

FIG. 12 is a graph illustrating an example of a simulation result of a return loss coefficient S11 of the antenna 100-7 according to the seventh configuration example.

The setting values for the simulation of FIG. 12 are as follows.

The thickness t1 of the first insulating portion 3-1: 4 mm (equal to the thickness of the insulating member 80)
The thickness t2 of the second insulating portion 3-2: 200 μm (equal to the thickness of the dielectric 7)
The dielectric constant of the dielectric 7: 2.0
The thickness of the grounding conductor 22: 43 μm
The thickness of the signal line 21a: 43 μm
The thickness of the signal line 21b: 43 μm
The thickness of the antenna conductor 120: 43 μm As can be seen from FIG. 12, sufficient return loss characteristics, antenna gain, and radiation efficiency are obtained at around the frequency of 3.7 GHz.

The antenna 100-7 includes a signal line in a loop antenna shape connected to the transmission line provided on the flexible substrate (a balanced transmission line connected in a loop antenna shape), and is configured so that the antenna conductor is connected to the transmission line via the signal line. According to this configuration, for the frequency band of Sub 6, the antenna 100-7 that has a high antenna gain for electromagnetic waves of which the polarization plane varies and that is resistant against noise (i.e., a high signal-to-noise ratio) can be provided.

Figure 13B:
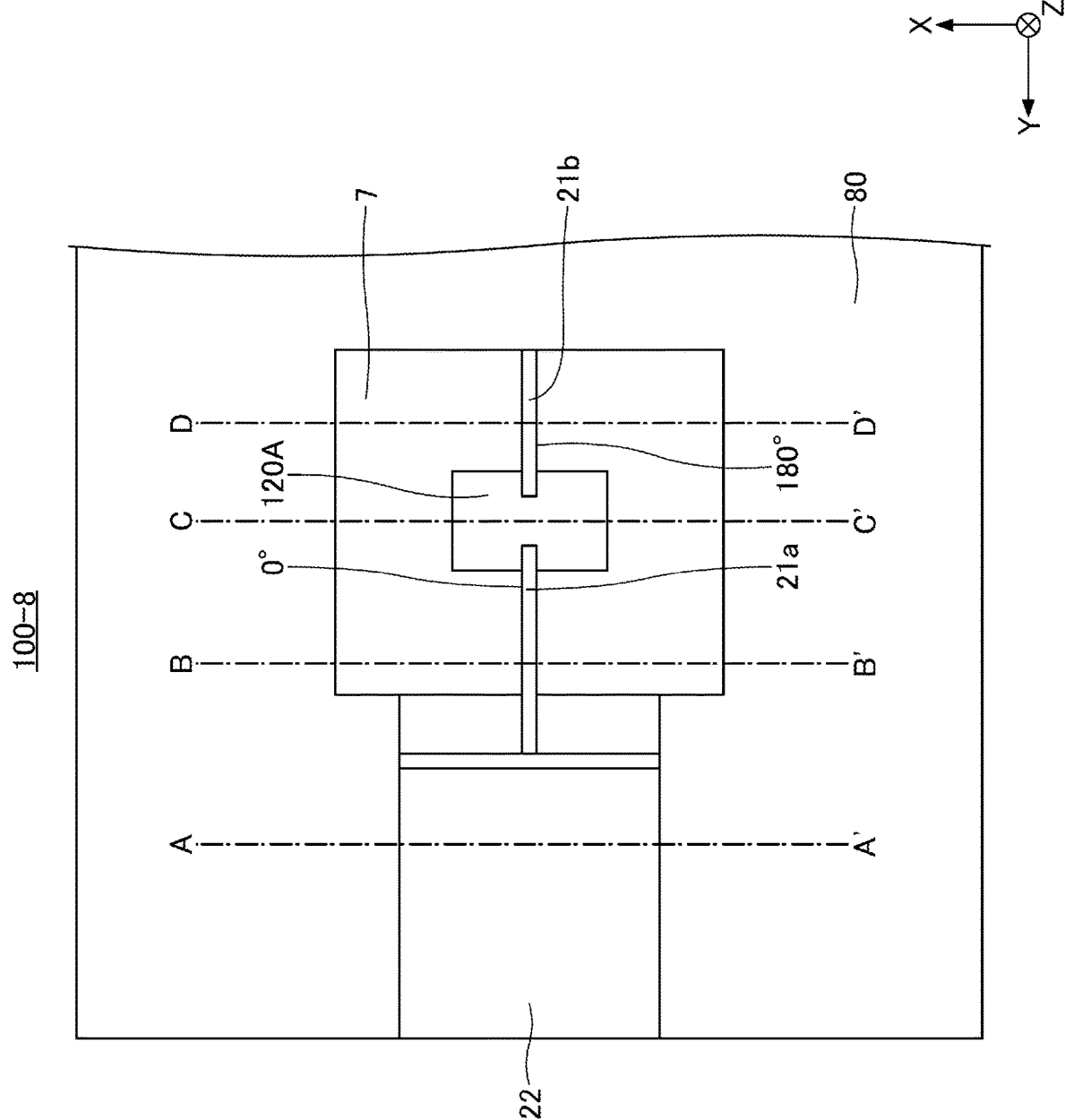
FIG. 13B is a plan view illustrating the antenna 100-8 according to the eighth configuration example.
Figure 14A:
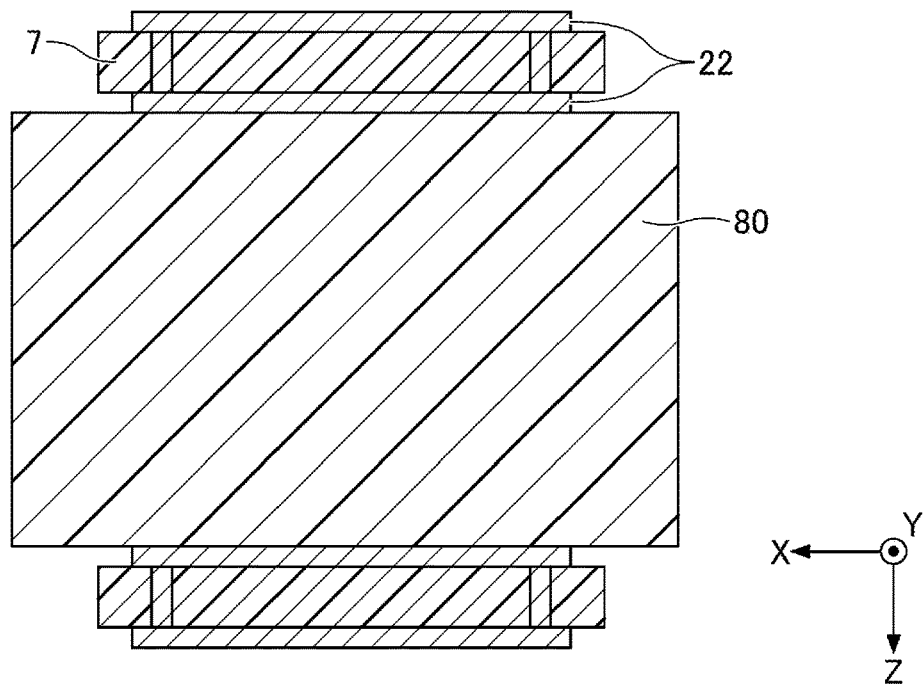
FIG. 14A is a cross-sectional view taken along line A-A' of FIG. 13B.
Figure 14B:
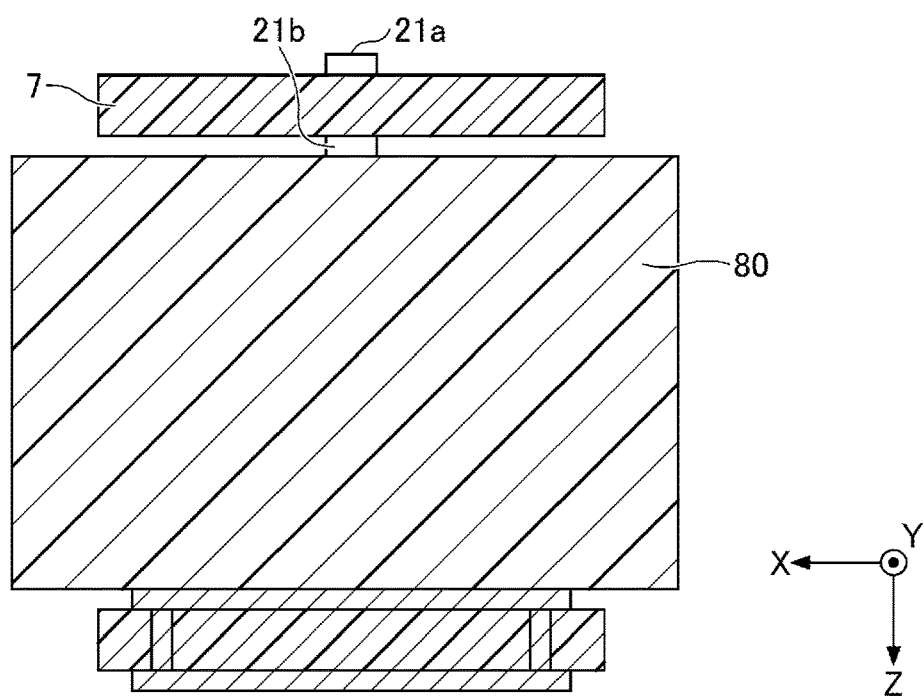
FIG. 14B is a cross-sectional view taken along line B-B' of FIG. 13B.
Figure 14C:
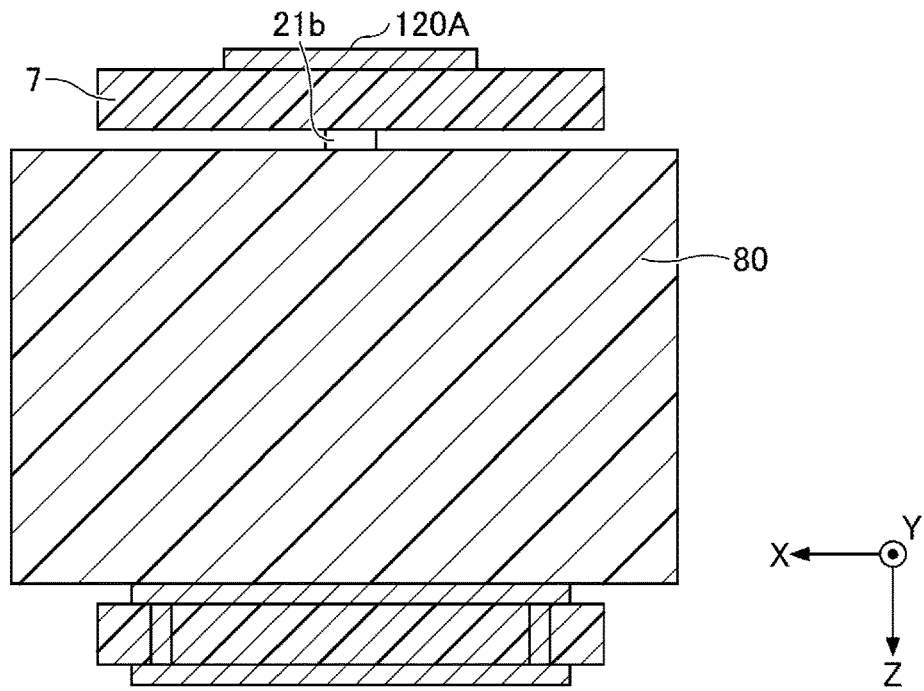
FIG. 14C is a cross-sectional view taken along line C-C' of FIG. 13B.
Figure 14D:
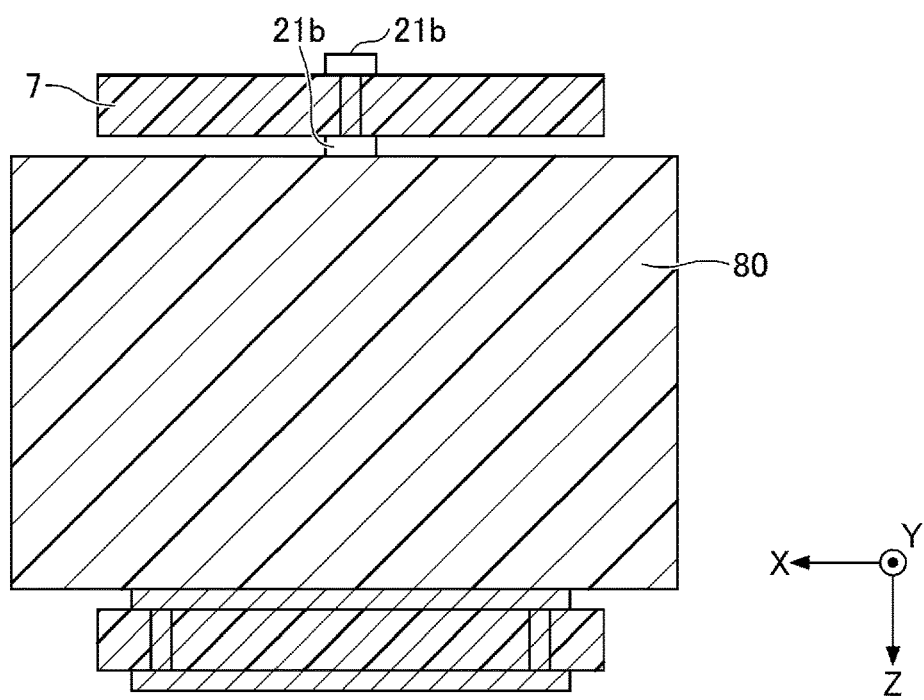
FIG. 14D is a cross-sectional view taken along line D-D' of FIG. 13B.

FIG. 13A is a perspective view of an antenna 100-8 according to an eighth configuration example. FIG. 13B is a plan view illustrating the antenna 100-8 according to the eighth configuration example. FIG. 14A is a cross-sectional view taken along line A-A' of FIG. 13B. FIG. 14B is a cross-sectional view taken along line B-B' of FIG. 13B. FIG. 14C is a cross-sectional view taken along line C-C' of FIG. 13B. FIG. 14D is a cross-sectional view taken along line D-D' of FIG. 13B. Explanation about the configurations and effects similar to the above-described antenna is omitted or abbreviated by incorporating the above explanation by reference. The antenna 100-8 is different from the antenna 100-7 in that the antenna 100-8 is provided with a delay line in the signal line 21b.

The signal line 21a extends from the grounding conductor 22 toward the antenna conductor 120A in the negative Y axis direction and is connected to the antenna conductor 120A. The signal line 21b is of a shape that extends from the grounding conductor 22 toward the antenna conductor 120A in the negative Y axis direction, pass across the antenna conductor 120A, and be folded toward the antenna conductor 120A through vias in an area on the negative side of the antenna conductor 120A in the Y axis. The folded-back shaped portion of the signal line 21b functions as a delay line, so that the antenna 100-8 is excited with phases of 0 degrees and 180 degrees at the feeding point.

Figure 15:
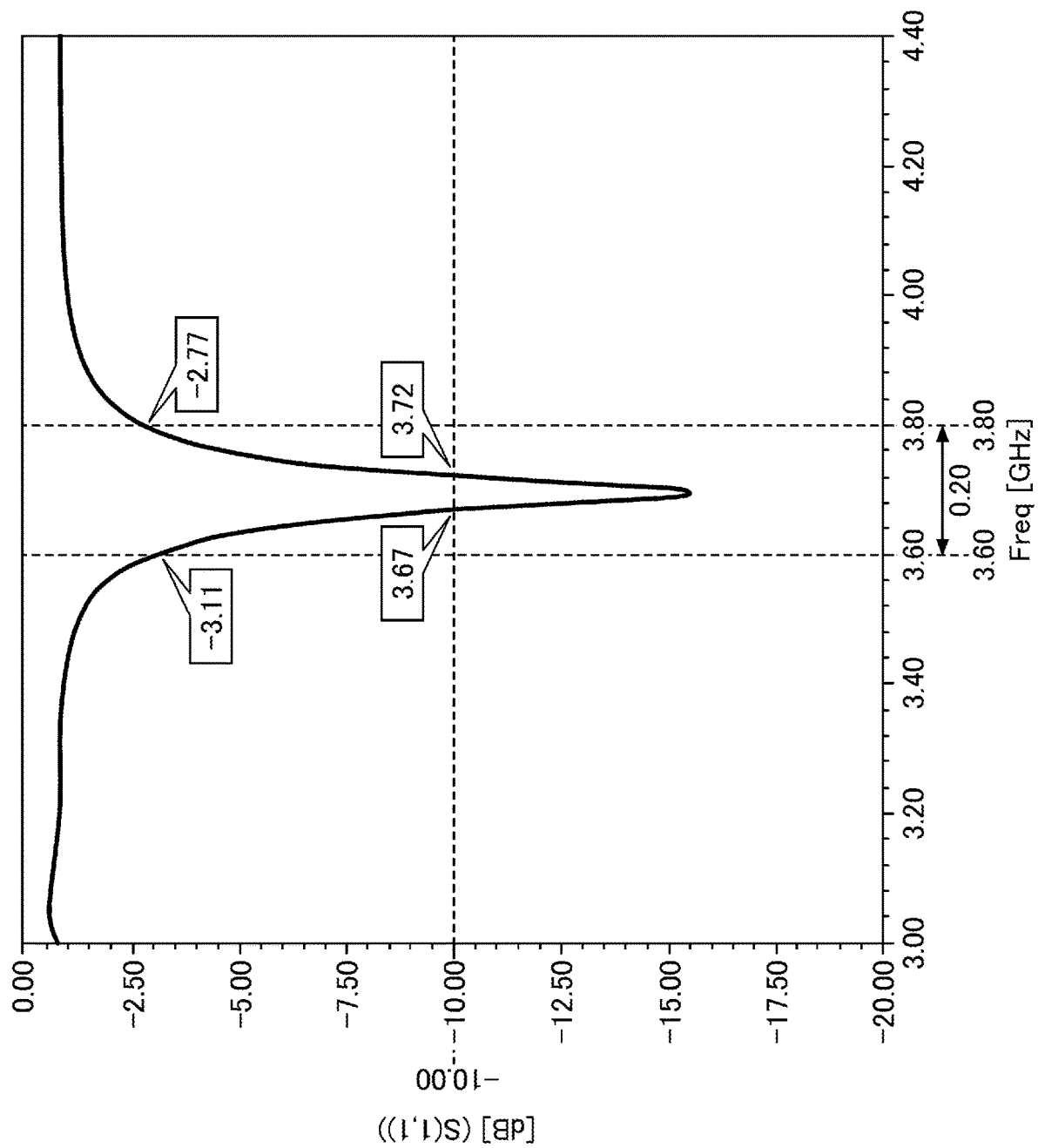
FIG. 15 is a graph illustrating an example of a simulation result of a return loss coefficient S11 of the antenna 100-8 according to the eighth configuration example.

FIG. 15 is a graph illustrating an example of a simulation result of a return loss coefficient S11 of the antenna 100-8 according to the eighth configuration example.

The setting values for the simulation of FIG. 15 are as follows.

The thickness t1 of the first insulating portion 3-1: 4 mm (equal to the thickness of the insulating member 80)
The thickness t2 of the second insulating portion 3-2: 200 µm (equal to the thickness of the dielectric 7)
The dielectric constant of the dielectric 7: 2.0
The thickness of the grounding conductor 22: 43 µm
The thickness of the signal line 21a: 43 µm
The thickness of the signal line 21b: 43 µm
The thickness of the antenna conductor 120: 43 µm As can be seen from FIG. 15, sufficient return loss characteristics, antenna gain, and radiation efficiency are obtained at around the frequency of 3.7 GHz.

In the antenna 100-8, the signal line 12a and the signal line 12b include a balanced transmission line having a delay line. According to this configuration, for the frequency band of Sub 6, the antenna gain can be increased with a configuration that is simpler than the loop antenna.

Figure 16:
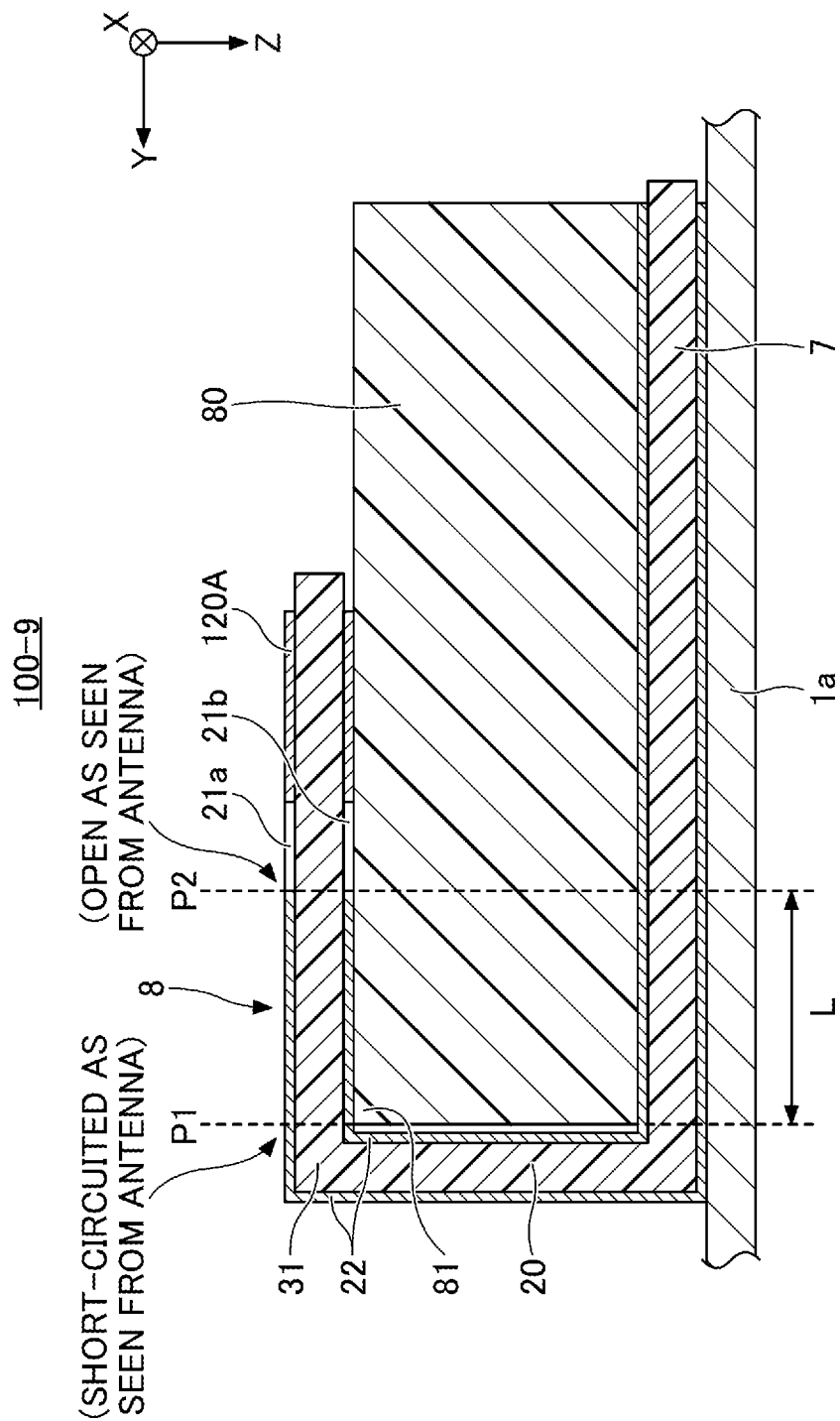
FIG. 16 is a cross-sectional view illustrating a folded portion of an antenna 100-9 according to a ninth configuration example.

FIG. 16 is a cross-sectional view illustrating a folded portion of an antenna 100-9 according to a ninth configuration example. Explanation about the configurations and effects similar to the above-described antenna is omitted or abbreviated by incorporating the above explanation by reference. The difference from the antenna 100-7 is that the transmission line 20 (the flexible substrate 30) includes an end-shorted choke structure 8 (an end-shortening circuit) having a length L corresponding to λ/4 from the fold-back position of the grounding conductor 22. "λ" denotes a center wavelength of a predetermined frequency band.

When the insulating member 80 is sandwiched in the folded portion 31, the grounding conductor 22 (ground) that is folded by a corner portion 81 of the insulating member 80 is present on a plane of P1 of the insulating member 80. Specifically, as seen from the antenna conductor 120A, the ground (the grounding conductor 22) is present on the plane of P1 of the insulating member 80. Therefore, from the antenna conductor 120A, a length L can be set so that this portion at the grounding conductor 22 is short-circuited, and the position corresponding to ¼ of the wavelength λ is open. Specifically, the antenna 100-9 is provided with a choke structure (an end-shortening circuit) that is formed at the position away by the length L, corresponding to λ/4, from the fold-back position P1 of the grounding conductor 22 toward the antenna conductor 120A. Accordingly, a position P2 away by the length L from the fold-back position P1 of the grounding conductor 22 becomes an open point as seen from the antenna conductor 120A, so that the effect of not reducing the performance of the antenna conductor 120A can be achieved.

Figure 17A:
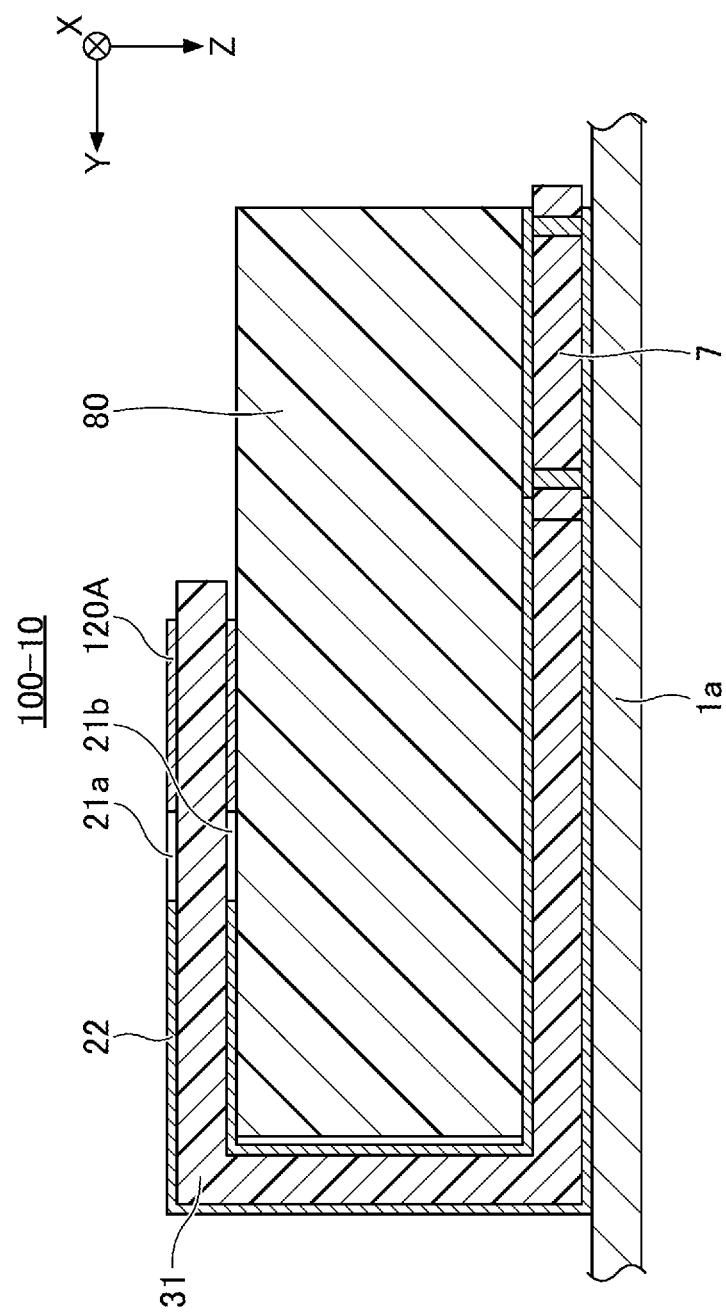
FIG. 17A is a cross-sectional view illustrating a folded portion of an antenna 100-10 according to a tenth configuration example.
Figure 17B:
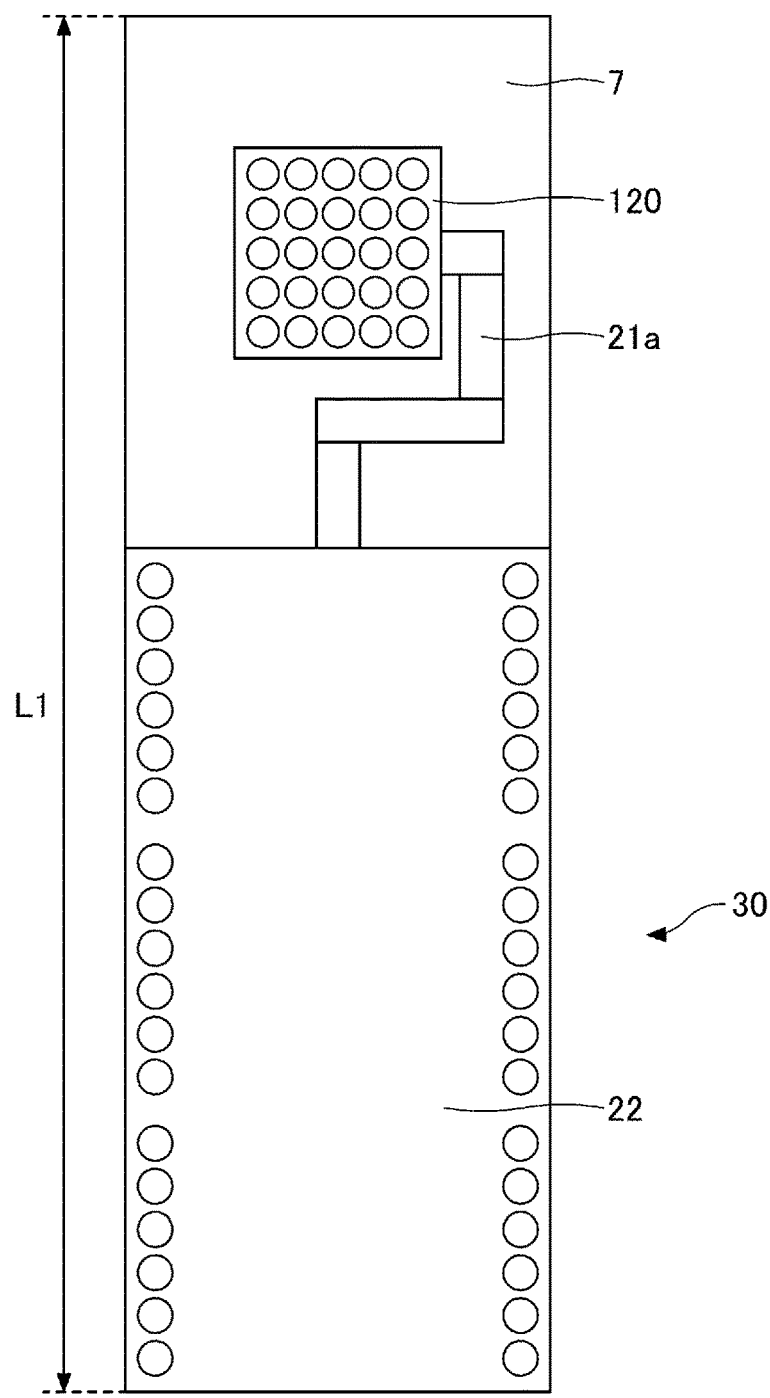
FIG. 17B is a drawing illustrating a comparative example of the flexible substrate 30 used for the antenna 100-10.

FIG. 17A is a cross-sectional view illustrating a folded portion of an antenna 100-10 according to a tenth configuration example. FIG. 17B is a drawing illustrating a comparative example of the flexible substrate 30 used for the antenna 100-10. FIG. 17C is a drawing illustrating a configuration example of the flexible substrate 30 used for the antenna 100-10. The antenna 100-10 is different from the antenna 100-7 in that the antenna 100-10 uses a flexible substrate 30A of which the shape in a plan view in the XY plane is an L shape.

The flexible substrate 30 as illustrated in FIG. 17B is a band-shaped substrate of which the maximum size L1 is, for example, 200 mm or more. In order to dice the above-described flexible substrate 30 from a base material (a workpiece) of a printed board, a workpiece larger than the maximum size L1 of the flexible substrate 30 is needed, which imposes a limitation on the workpiece size.

The flexible substrate 30A of the antenna 100-10 according to the tenth configuration example has such a structure that the grounding conductor 22 is bent into an L shape on the planar circuit, and therefore, the maximum size L2 of the flexible substrate 30A can be configured to be smaller than the maximum size L1 of the flexible substrate 30. The maximum size L2 is, for example, a value from 120 mm to 190 mm. Therefore, for example, the flexible substrate 30A can be manufactured using a generally-available workpiece with a size of 200 mm by 200 mm, and the manufacturing cost of the antenna 100-10 can be reduced.

Figure 18:
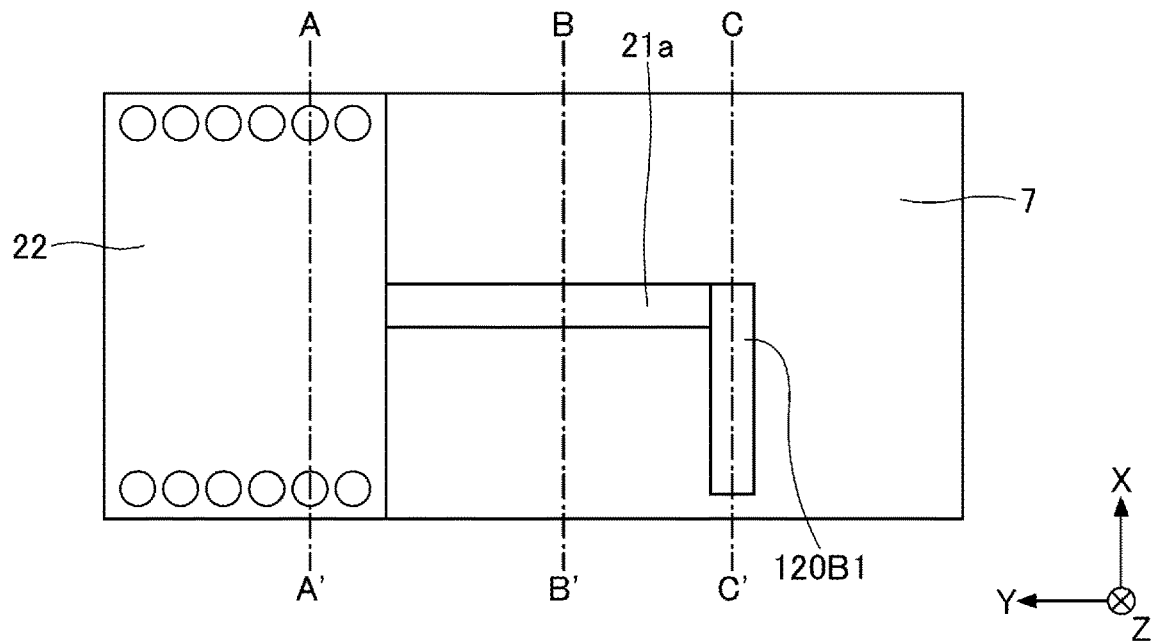
FIG. 18 is a plan view illustrating an antenna 100-11 according to an eleventh configuration example.
Figure 19A:
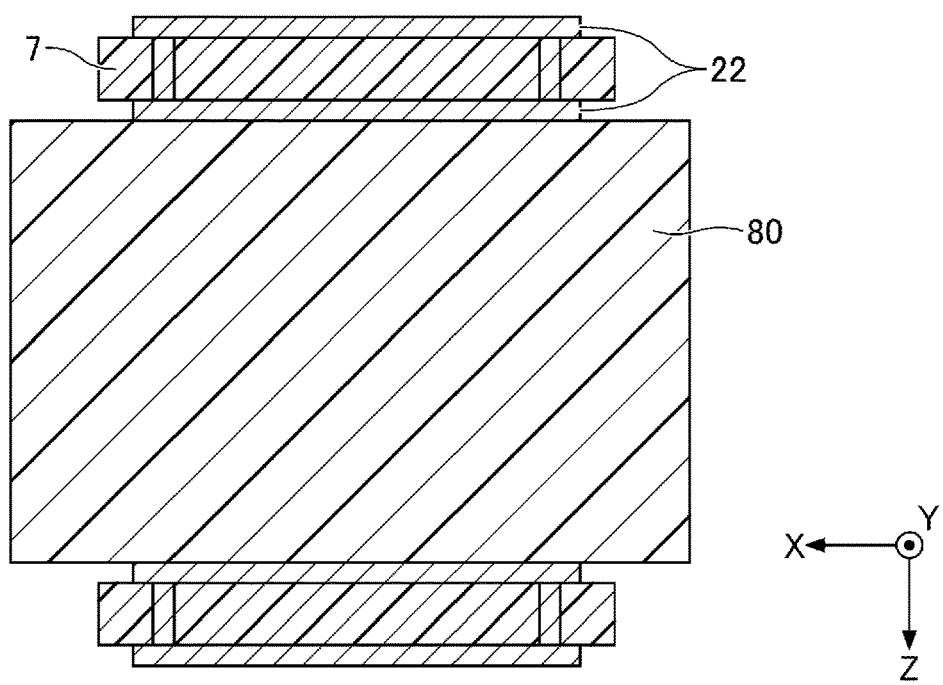
FIG. 19A is a cross-sectional view taken along line A-A' of FIG. 18B.
Figure 19B:
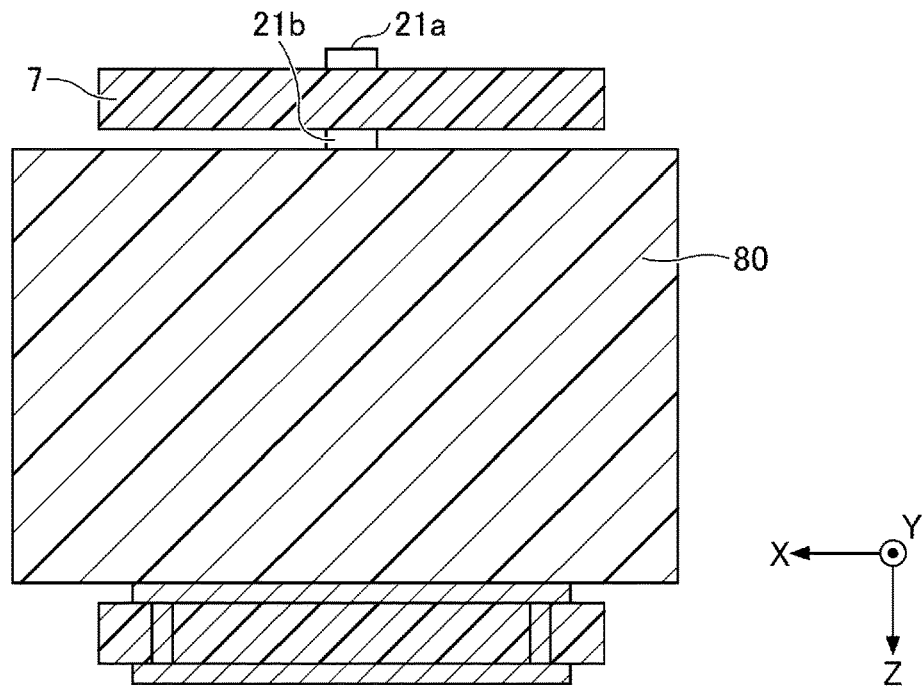
FIG. 19B is a cross-sectional view taken along line B-B' of FIG. 18B.
Figure 19C:
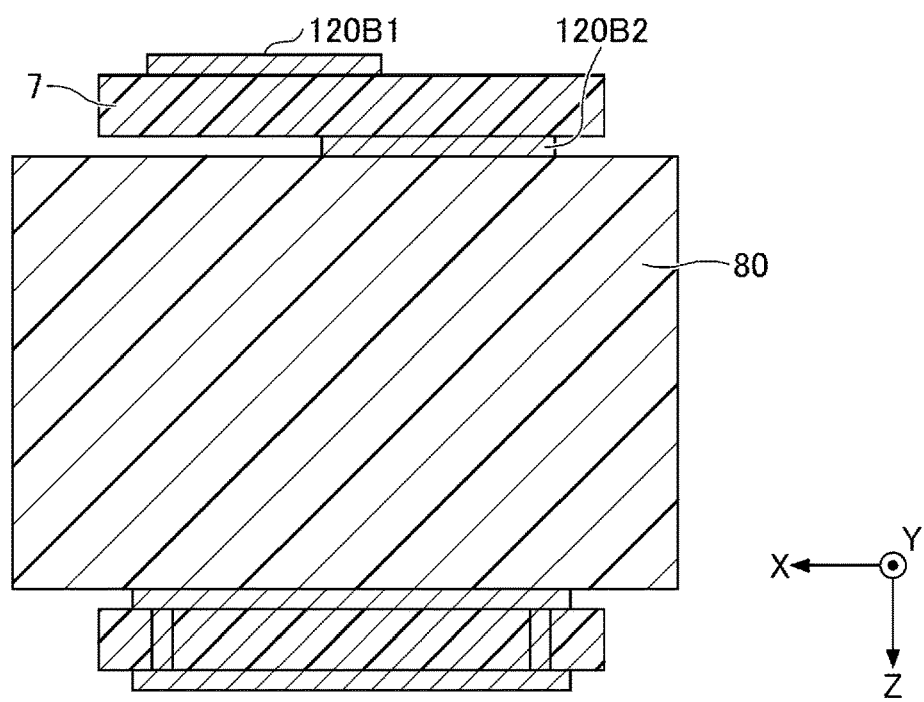
FIG. 19C is a cross-sectional view taken along line C-C' of FIG. 18B.

FIG. 18 is a plan view illustrating an antenna 100-11 according to an eleventh configuration example. FIG. 19A is a cross-sectional view taken along line A-A' of FIG. 18B. FIG. 19B is a cross-sectional view taken along line B-B' of FIG. 18B. FIG. 19C is a cross-sectional view taken along line C-C' of FIG. 18B. Explanation about the configurations and effects similar to the above-described antenna is omitted or abbreviated by incorporating the above explanation by reference. The antenna 100-11 is different from the antenna 100-8 in that, in the antenna 100-11, an antenna conductor 120B1 and an antenna conductor 120B2 constituting a dipole antenna are connected to signal lines 21a and 21b constituting a balanced transmission line. According to this configuration, for the frequency band of Sub 6, the antenna 100-11 can be provided, wherein the antenna 100-11 has a simplified structure to improve the reliability and a high antenna gain for electromagnetic waves of which the polarization plane varies, and the antenna 100-11 is resistant against noise (i.e., a high signal-to-noise ratio).

Figure 20:
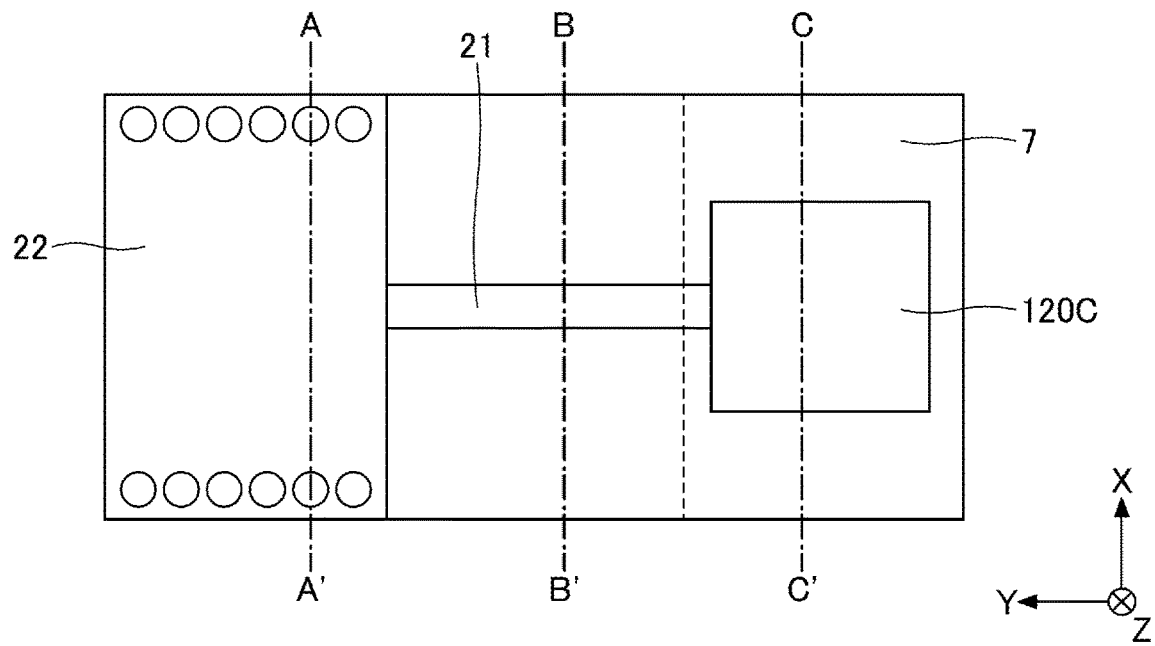
FIG. 20 is a plan view illustrating an antenna 100-12 according to a twelfth configuration example.
Figure 21A:
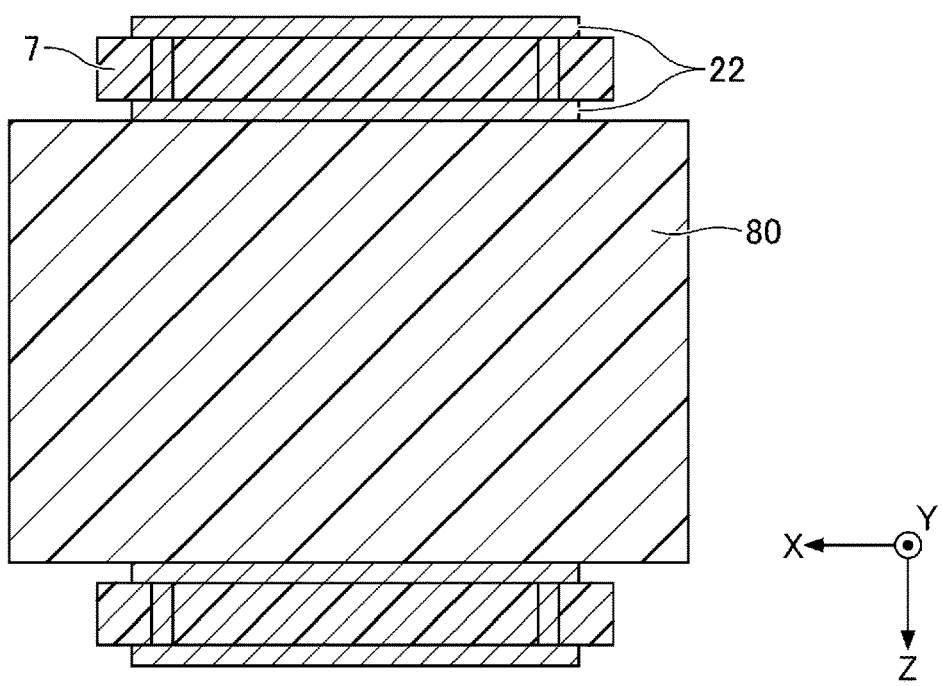
FIG. 21A is a cross-sectional view taken along line A-A' of FIG. 20B.
Figure 21B:
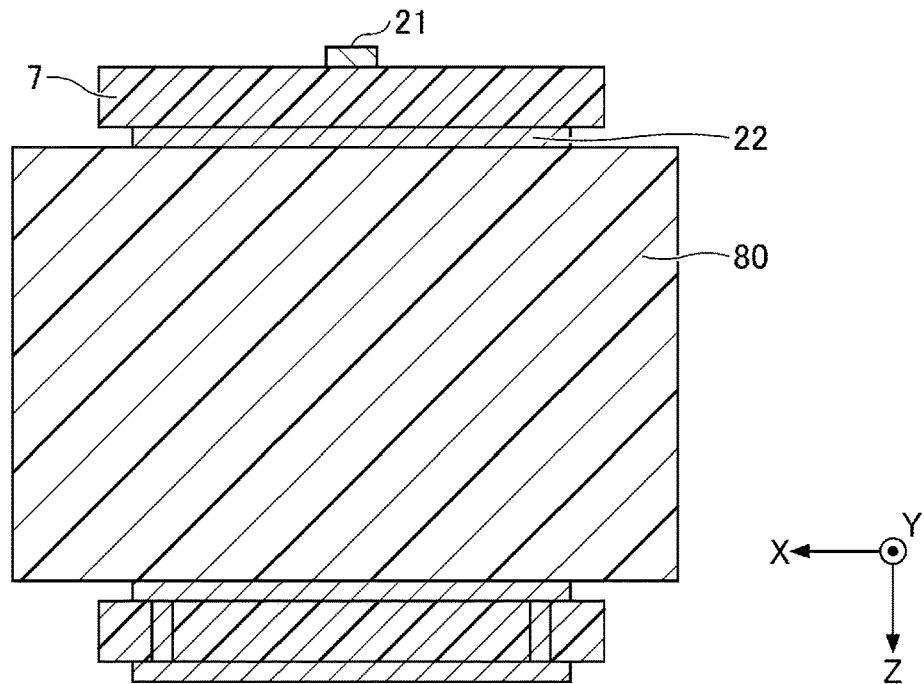
FIG. 21B is a cross-sectional view taken along line B-B' of FIG. 20B.
Figure 21C:
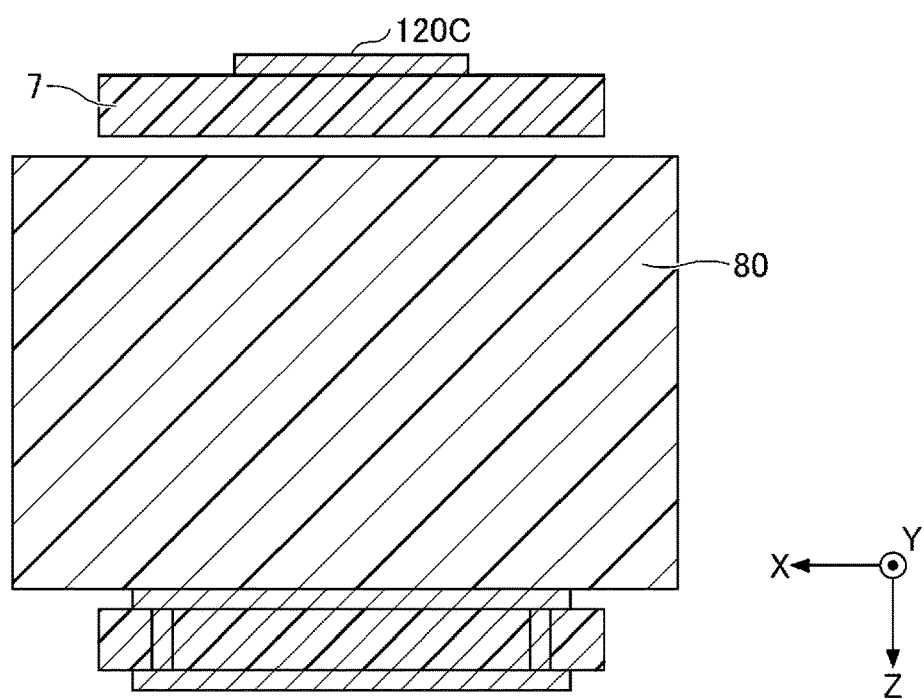
FIG. 21C is a cross-sectional view taken along line C-C' of FIG. 20B.

FIG. 20 is a plan view illustrating an antenna 100-12 according to a twelfth configuration example. FIG. 21A is a cross-sectional view taken along line A-A' of FIG. 20B. FIG. 21B is a cross-sectional view taken along line B-B' of FIG. 20B. FIG. 21C is a cross-sectional view taken along line C-C' of FIG. 20B. Explanation about the configurations and effects similar to the above-described antenna is omitted or abbreviated by incorporating the above explanation by reference. The antenna 100-12 is different from the antenna 100-8 in that, in the antenna 100-12, an antenna conductor 120C, i.e., a monopole antenna, is connected to the signal line 21, i.e., a microstrip line. According to this configuration, for the frequency band of Sub 6, the antenna 100-12 can be provided, herein the footprint of an antenna element of the antenna 100-12 is small, and the antenna 100-12 is small and is excellent in appearance.

Figure 22:
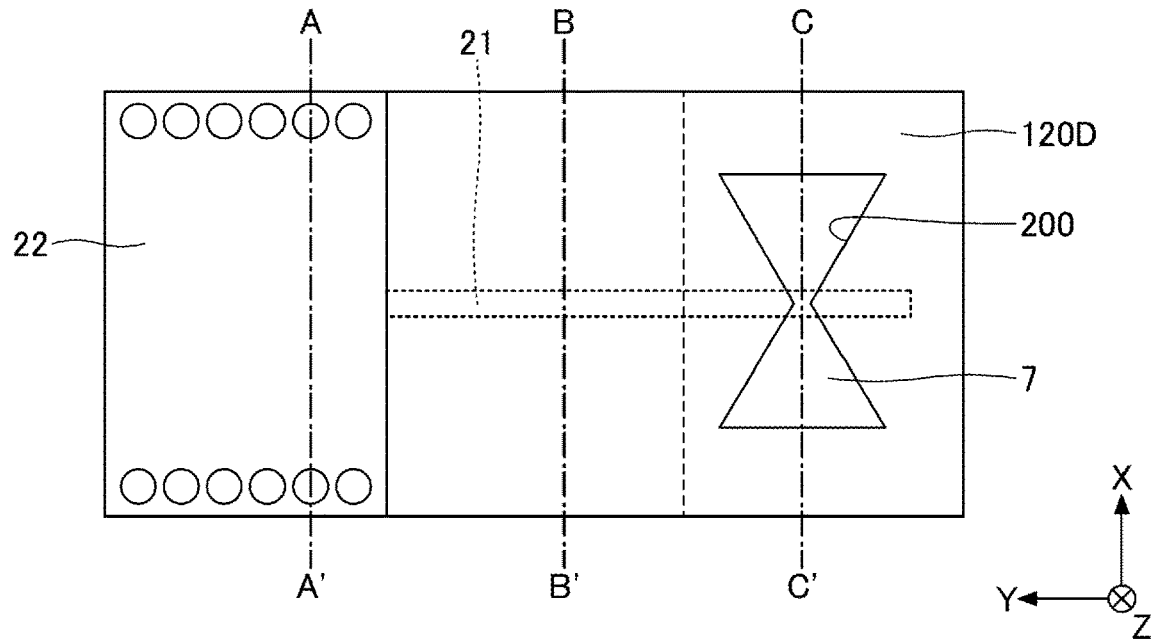
FIG. 22 is a plan view illustrating an antenna 100-13 according to a thirteenth configuration example.
Figure 23A:
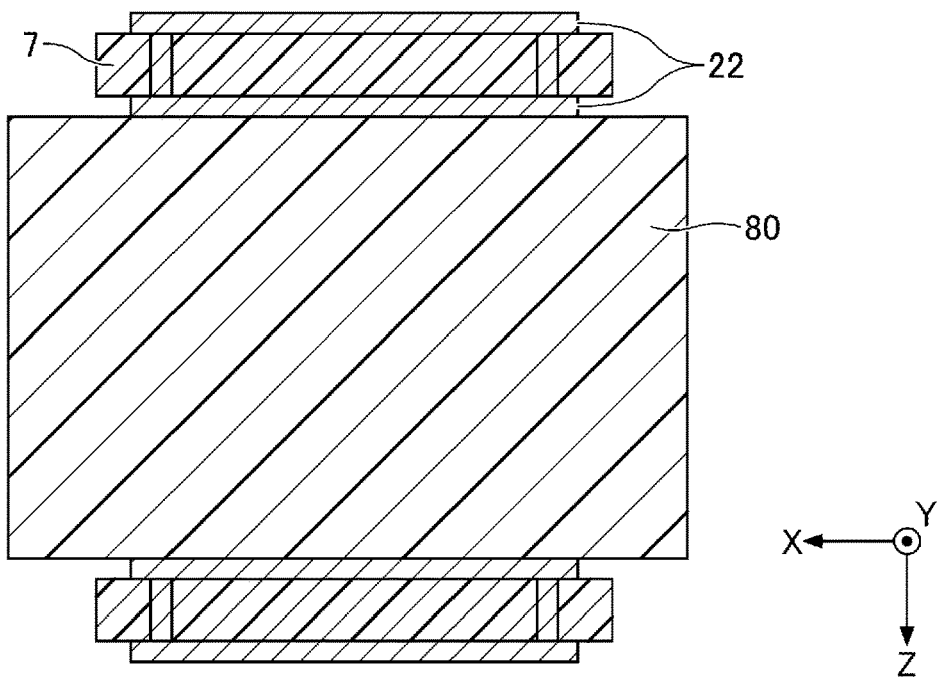
FIG. 23A is a cross-sectional view taken along line A-A' of FIG. 22B.
Figure 23B:
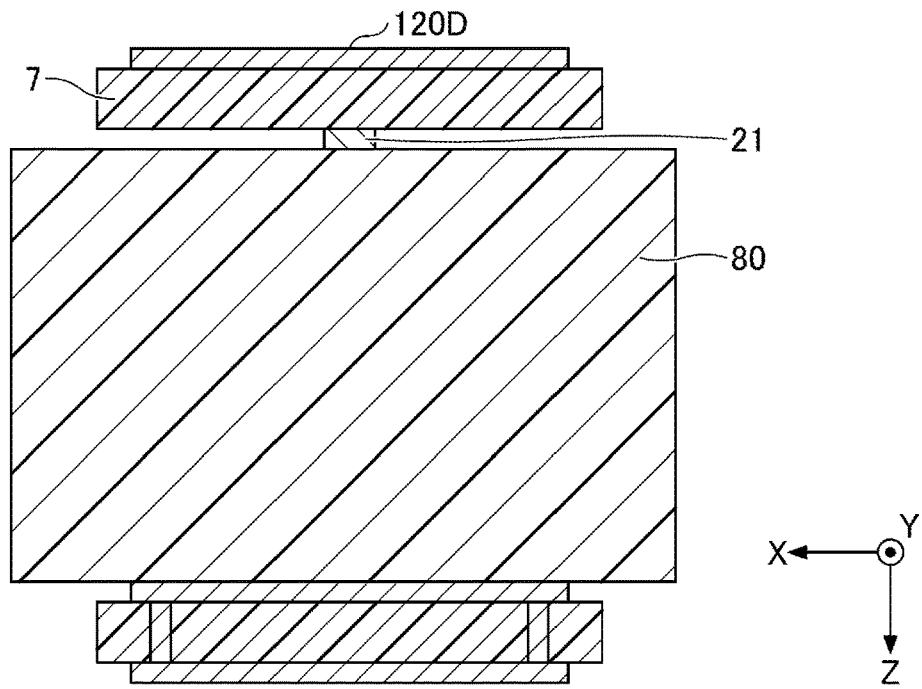
FIG. 23B is a cross-sectional view taken along line B-B' of FIG. 22B.
Figure 23C:
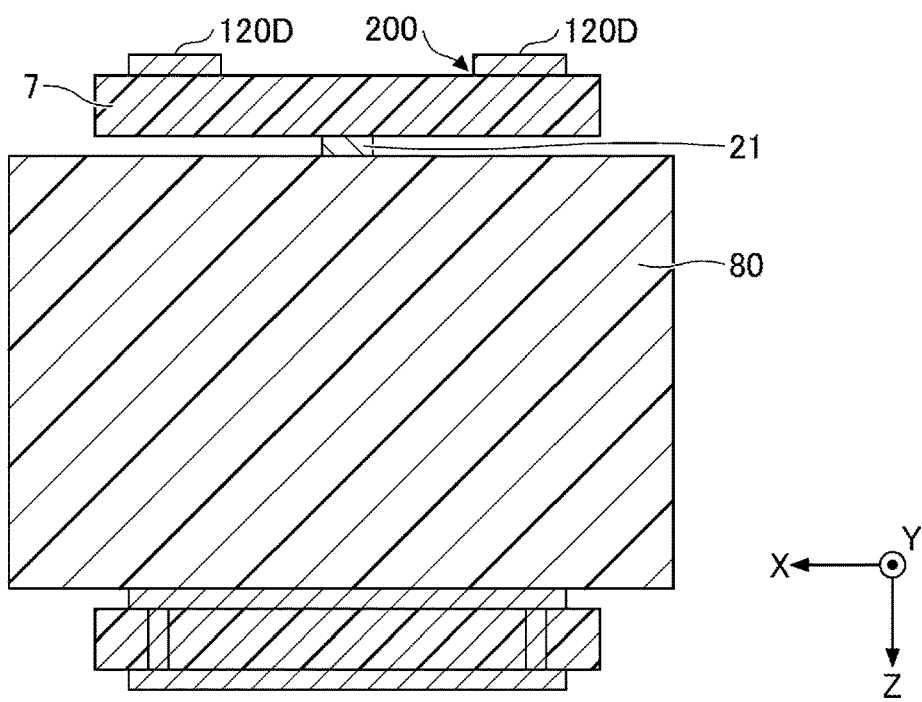
FIG. 23C is a cross-sectional view taken along line C-C' of FIG. 22B.

FIG. 22 is a plan view illustrating an antenna 100-13 according to a thirteenth configuration example. FIG. 23A is a cross-sectional view taken along line A-A' of FIG. 22B. FIG. 23B is a cross-sectional view taken along line B-B' of FIG. 22B. FIG. 23C is a cross-sectional view taken along line C-C' of FIG. 22B. Explanation about the configurations and effects similar to the above-described antenna is omitted or abbreviated by incorporating the above explanation by reference. The antenna 100-13 is different from the antenna 100-8 in that, in the antenna 100-13, an antenna conductor 120D, i.e., a bow-tie antenna, is connected to the signal line 21, i.e., a microstrip line. The antenna conductor 120D is structured by forming a hexagonal slot 200 in the conductor pattern. The antenna 100-13 is small and low-cost, and furthermore can achieve a high antenna gain over a wide band.

Figure 24A:
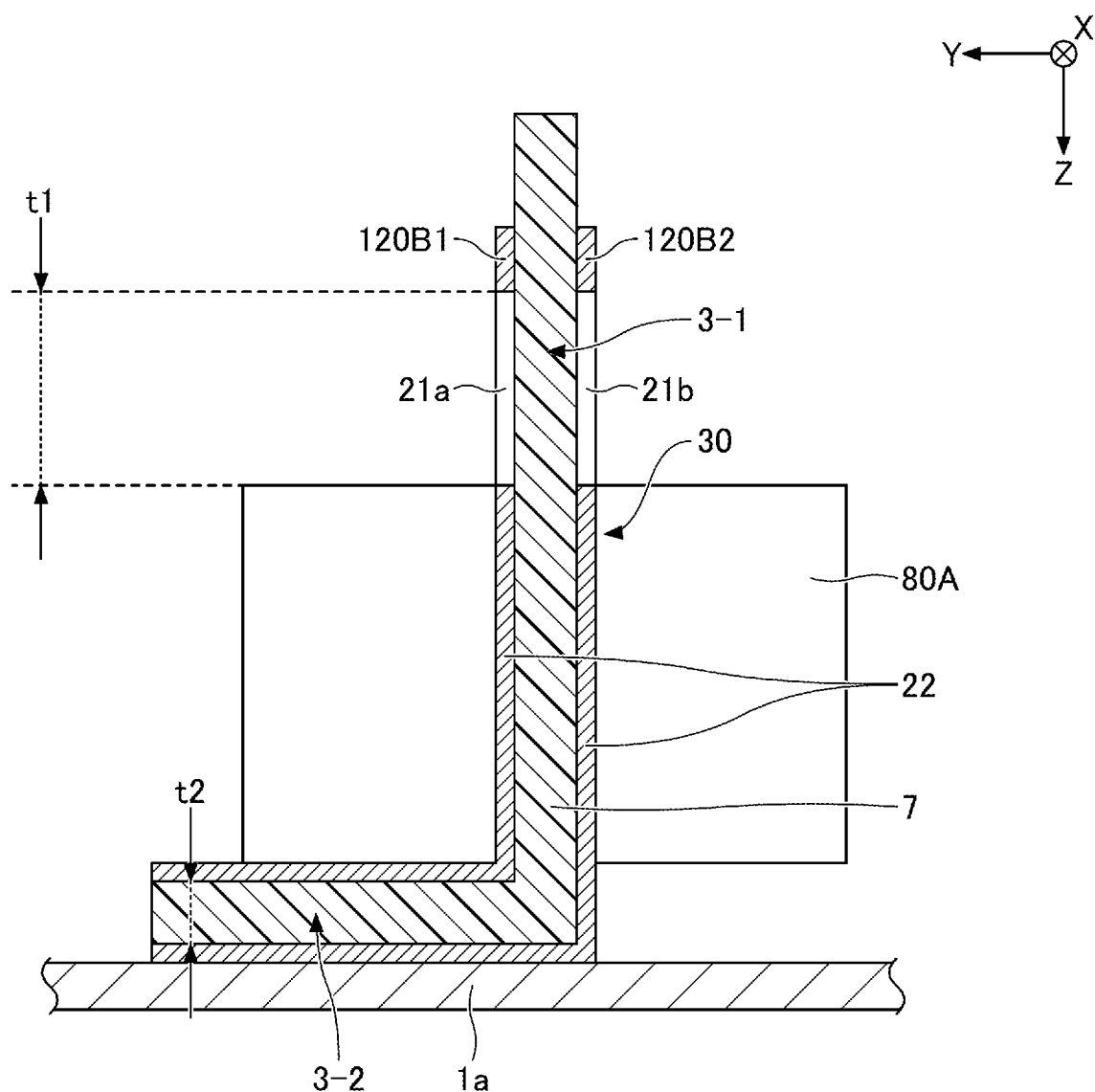
FIG. 24A is a first drawing illustrating a configuration example of an antenna 100-14 according to a fourteenth configuration example.
Figure 24B:
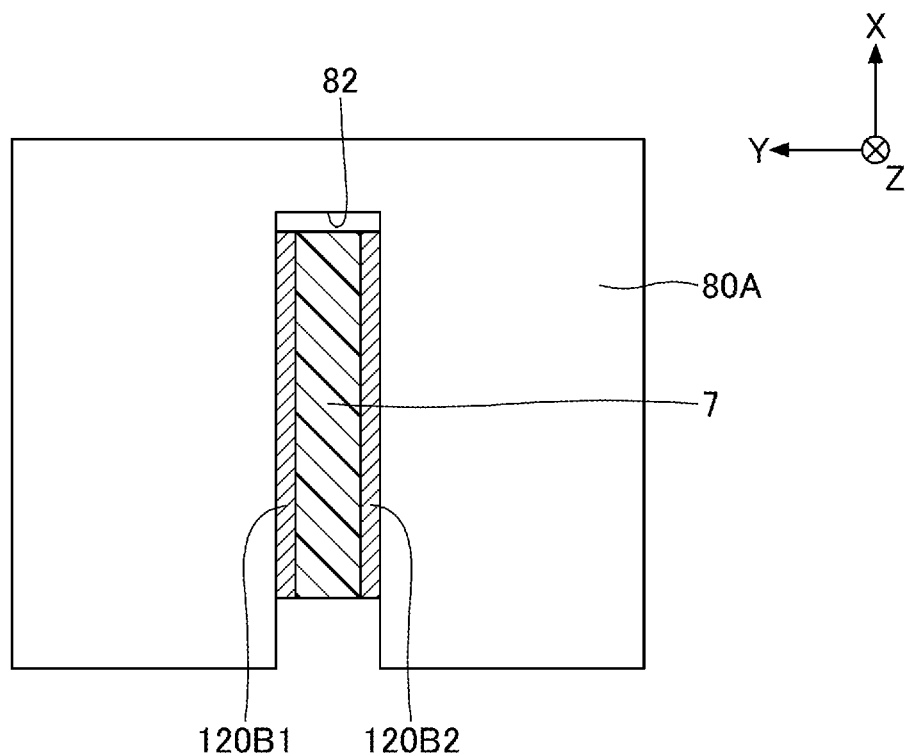
FIG. 24B is a second drawing illustrating the configuration example of the antenna 100-14 according to the fourteenth configuration example.
Figure 24C:
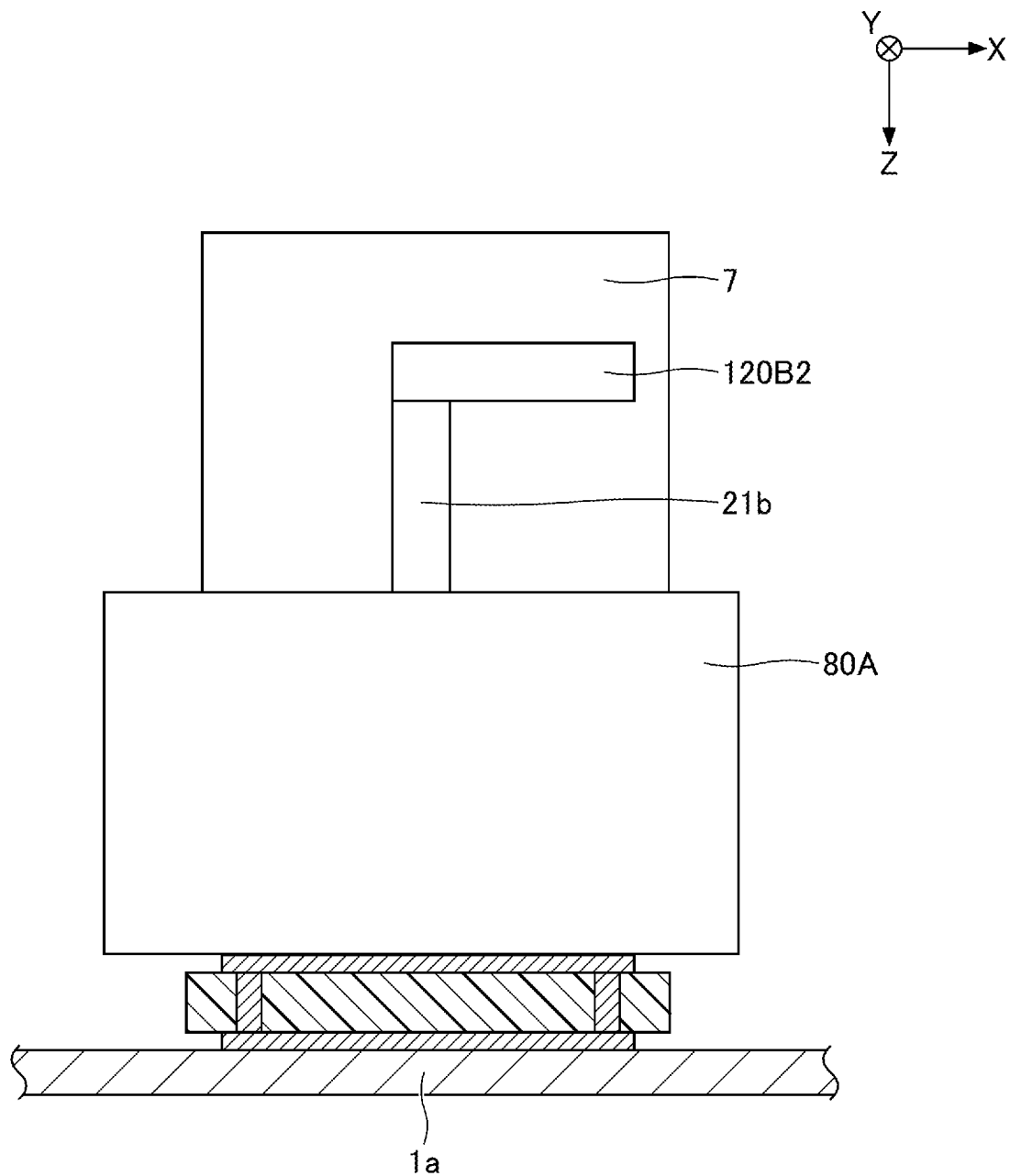
FIG. 24C is a third drawing illustrating the configuration example of the antenna 100-14 according to the fourteenth configuration example.

FIG. 24A is a first drawing illustrating the configuration example of an antenna 100-14 according to a fourteenth configuration example. FIG. 24B is a second drawing illustrating the configuration example of the antenna 100-14 according to the fourteenth configuration example. FIG. 24C is a third drawing illustrating the configuration example of the antenna 100-14 according to the fourteenth configuration example. FIG. 24A illustrates a plan view, in the YZ plane, of the antenna 100-14 as seen toward the positive X axis direction. FIG. 24B illustrates a plan view, in the XY plane, of the antenna 100-14 as seen toward the positive Z axis direction. FIG. 24C illustrates a plan view, in the ZX plane, of the antenna 100-14 as seen toward the plus Y axis direction. Explanation about the configurations and effects similar to the above-described antenna is omitted or abbreviated by incorporating the above explanation by reference. The antenna 100-14 is different from the antenna 100-11 in that, in the antenna 100-14, a flexible substrate 30 bent into an L shape is used, and a support 80A holding a portion extending in a direction substantially perpendicular to the chassis 1a of the flexible substrate 30 (the minus Z axis direction) is provided. The "direction substantially perpendicular" includes a direction parallel to a line segment that forms an angle of, for example, 0 degrees to ±15 degrees with respect to the horizontal plane perpendicular to the vertical direction.

The support 80A is made of, for example, a material similar to the material of the insulating member 80. The thickness of the support 80A in each of the directions of the X axis, Y axis, and Z axis is set to, for example, a value of 25 mm to 50 mm. The shape of the support 80A in a plan view in the XY plane as seen toward the positive Z axis direction is a C shape or a U shape, and a concave portion 82 in a shape of a groove is formed in a center portion of the support 80A. The flexible substrate 30 extending in the minus Z axis direction is inserted into the concave portion 82, so that the flexible substrate 30 is supported.

A signal line 21a and a signal line 21b constituting a balanced transmission line formed on the dielectric 7 and an antenna conductor 120B1 and an antenna conductor 120B2 constituting a dipole antenna are provided on the minus Z axis direction of the support 80A. Accordingly, a first insulating portion 3-1 is formed on an opposite side of the support 80A from the chassis 1a, and a second insulating portion 3-2 is formed on the same side as the chassis 1a with respect to the support 80A. The thickness t1 of the first insulating portion 3-1 in the Z axis direction is greater than the thickness t2 of the second insulating portion 3-2 in the Z axis direction. The thickness t1 is set to, for example, a value of 1 mm to 30 mm, and the thickness t2 is set to, for example, a value of 24 µm to 300 µm.

According to the antenna 100-14, while the support 80A covers the flexible substrate 30, the antenna conductor (the antenna conductor 120B1 and the antenna conductor 120B2) can be spaced apart from the grounding conductor 22. Therefore, the gain of the antenna conductor can be improved, and also, the grounding conductor 22 is hidden, so that the design of the antenna 100-14 is improved.

Figure 25A:
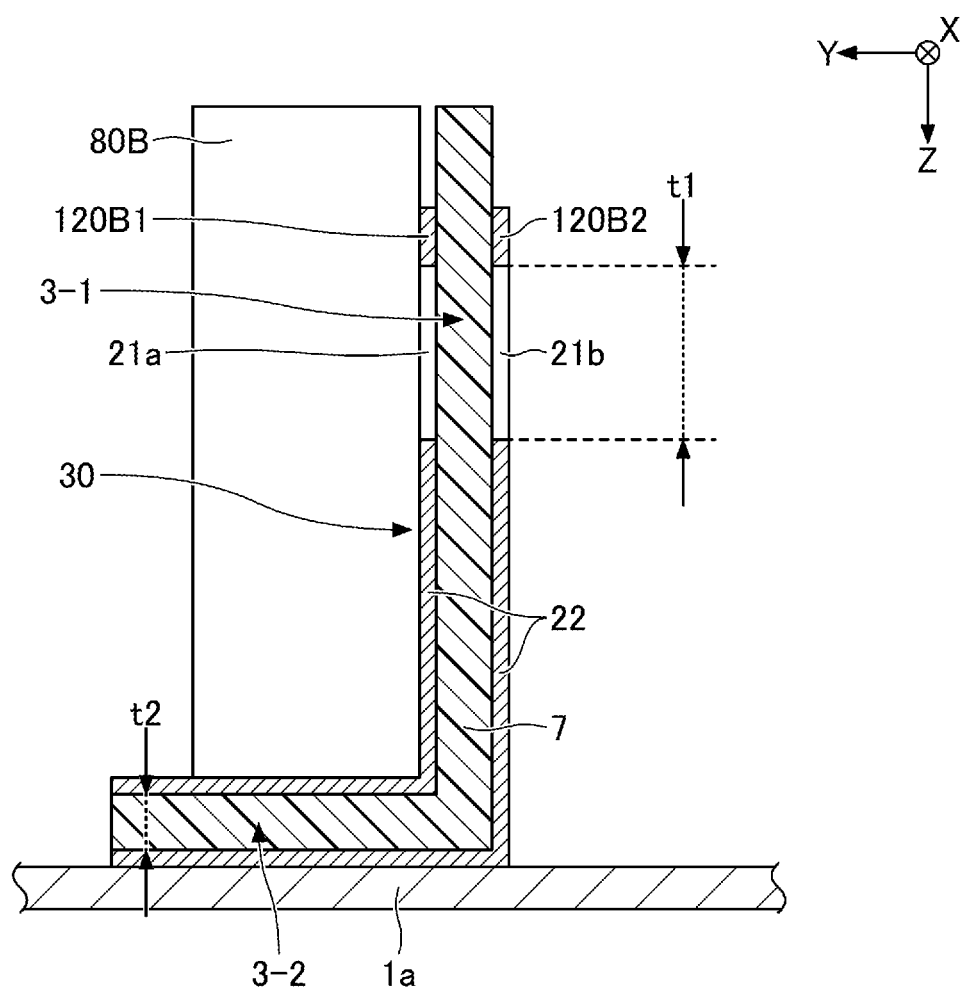
FIG. 25A is a first drawing illustrating a configuration example of an antenna 100-15 according to a fifteenth configuration example.
Figure 25B:
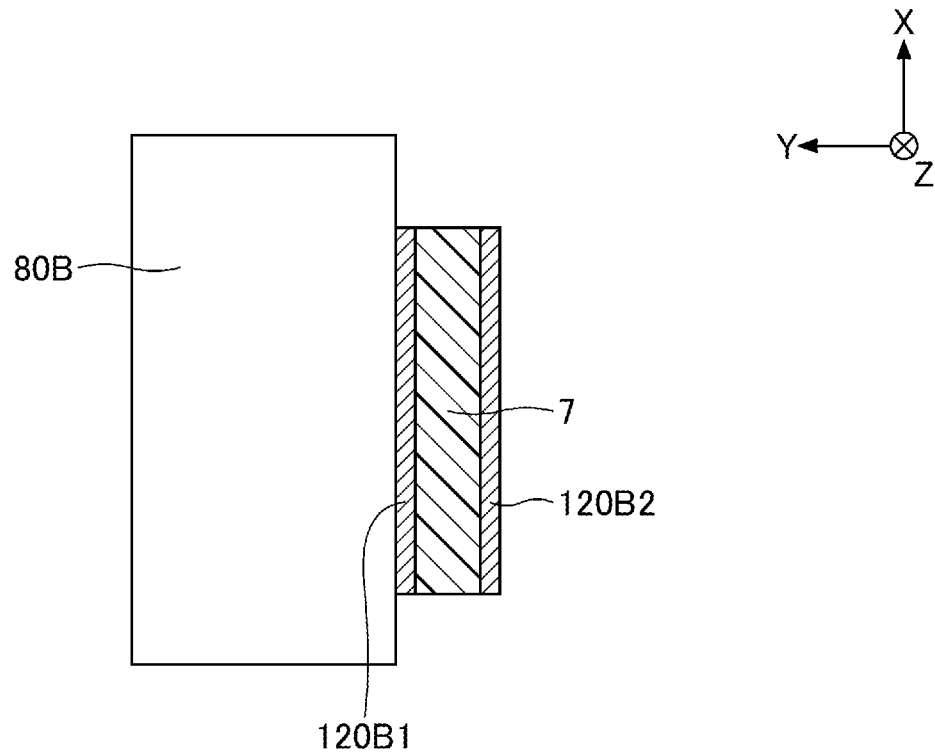
FIG. 25B is a second drawing illustrating the configuration example of the antenna 100-15 according to the fifteenth configuration example.
Figure 25C:
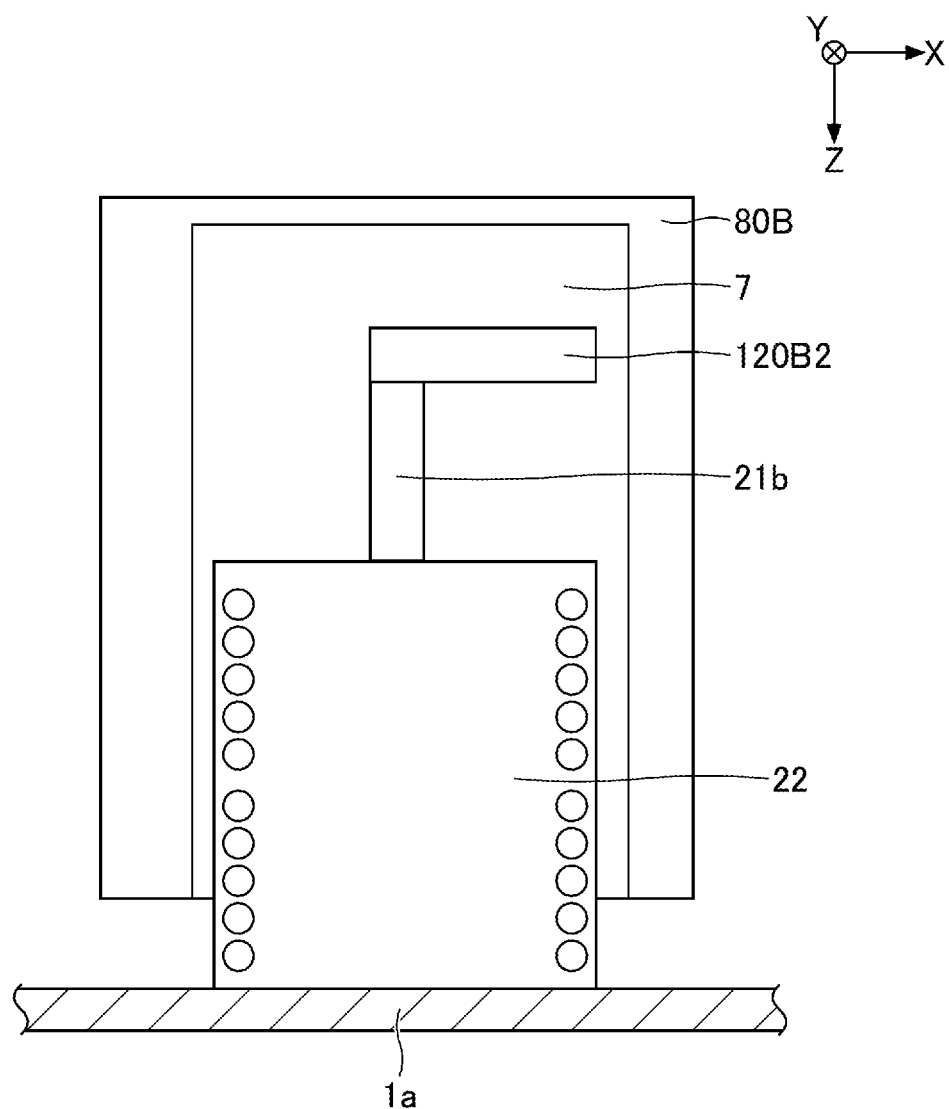
FIG. 25C is a third drawing illustrating the configuration example of the antenna 100-15 according to the fifteenth configuration example.

FIG. 25A is a first drawing illustrating a configuration example of an antenna 100-15 according to a fifteenth configuration example. FIG. 25B is a second drawing illustrating the configuration example of the antenna 100-15 according to the fifteenth configuration example. FIG. 25C is a third drawing illustrating the configuration example of the antenna 100-15 according to the fifteenth configuration example. FIG. 25A illustrates a plan view, in the YZ plane, of the antenna 100-15 as seen toward the positive X axis direction. FIG. 25B illustrates a plan view, in the XY plane, of the antenna 100-15 as seen toward the positive Z axis direction. FIG. 25C illustrates a plan view, in the ZX plane, of the antenna 100-15 as seen toward the plus Y axis direction. Explanation about the configurations and effects similar to the above-described antenna is omitted or abbreviated by incorporating the above explanation by reference. The antenna 100-15 is different from the antenna 100-14 in that the antenna 100-15 is provided with a support 80B in a shape of a rectangular parallelepiped that is in contact with the flexible substrate 30 extending in the minus Z axis direction.

The support 80B is made of, for example, a material similar to the material of the insulating member 80. The thickness of the support 80B in each of the directions of the X axis, Y axis, and Z axis is set to, for example, a value of 25 mm to 50 mm. The flexible substrate 30 extending in the minus Z axis direction is fixed to a side surface of the support 80B (an external peripheral surface on the negative Y axis direction). The thickness t1 of the first insulating portion 3-1 in the Z axis direction is greater than the thickness t2 of the second insulating portion 3-2 in the Z axis direction.

According to the antenna 100-15, while the flexible substrate 30 is fixed by the support 80B, the antenna conductor can be spaced apart from the grounding conductor 22. Therefore, the gain of the antenna conductor can be improved, and also, the increase in the manufacturing cost of the antenna 100-15 can be alleviated by using the support 80B having the simple structure.

Figure 26A:
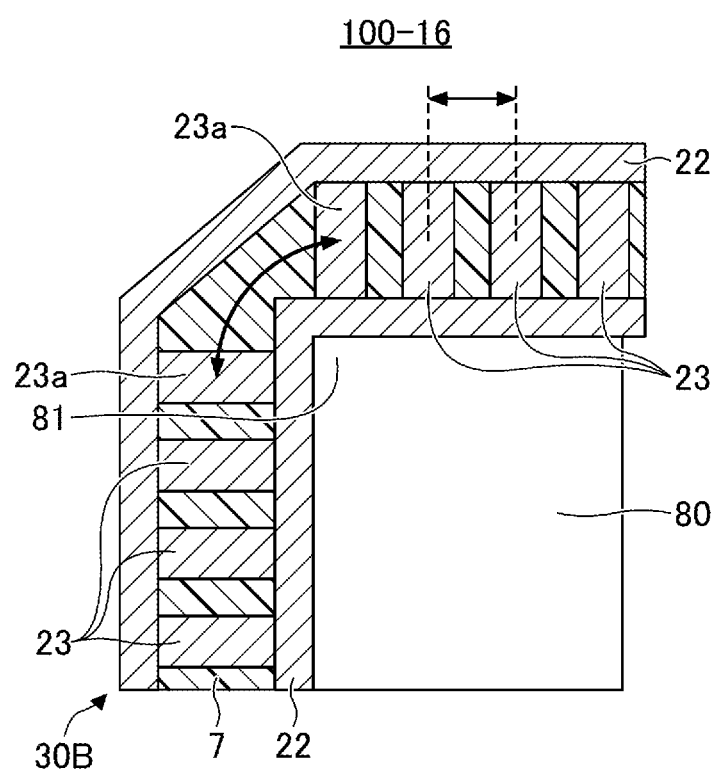
FIG. 26A is a partially enlarged view of an antenna 100-16 according to a sixteenth configuration example.
Figure 26B:
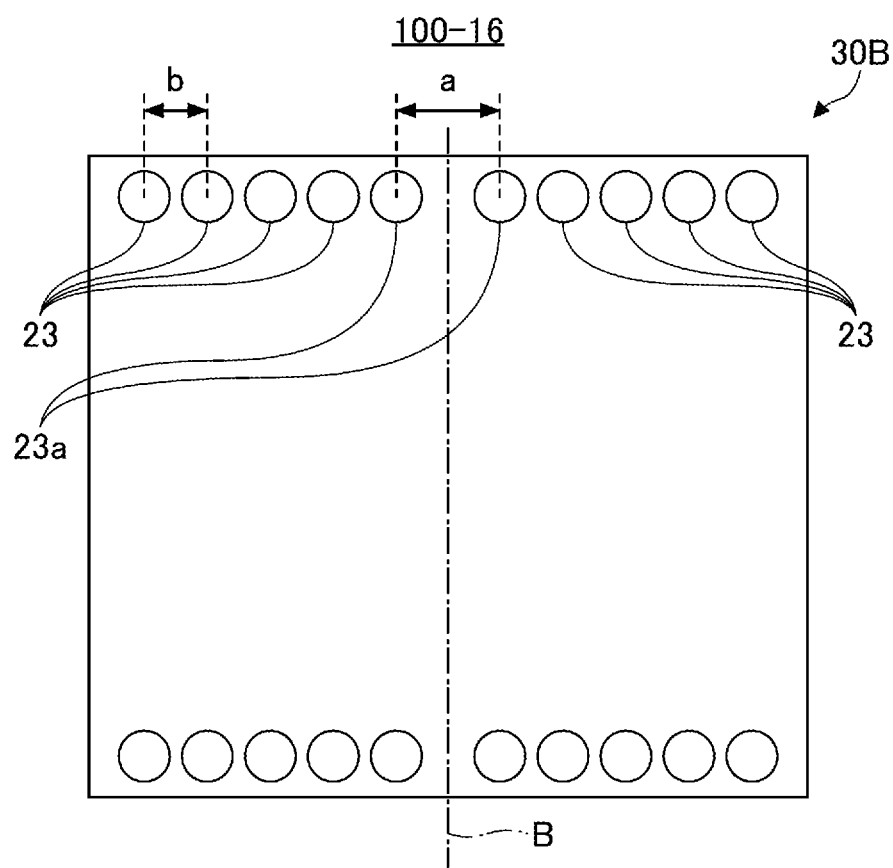
FIG. 26B is a drawing illustrating a flexible substrate 30B used for the antenna 100-16 according to the sixteenth configuration example before the flexible substrate 30B is folded.

FIG. 26A is a partially enlarged view of an antenna 100-16 according to a sixteenth configuration example. FIG. 26B is a drawing illustrating a flexible substrate 30B used for the antenna 100-16 according to the sixteenth configuration example before the flexible substrate 30B is folded. Explanation about the configurations and effects similar to the above-described antenna is omitted or abbreviated by incorporating the above explanation by reference. The flexible substrate 30B of the antenna 100-16 has such a structure that an arrangement interval a of multiple conductor posts 23a arranged across a fold-back position B is greater than an arrangement interval b of the multiple remaining conductor posts 23. The fold-back position B is a portion that is bent at a corner portion 81 of the insulating member 80. In a case where a conductor post 23 is provided at the fold-back position B, it becomes difficult to bend the flexible substrate 30B due to the conductor post 23, and if it is attempted to forcibly bend the flexible substrate 30B, a crack occurs in the conductor post 23. According to the antenna 100-16, by removing the conductor post 23 from the fold-back position B, the flexible substrate 30B can be bent smoothly along the corner portion 81 of the insulating member 80. In terms of electricity, if the arrangement interval a is sufficiently short with respect to the effective wavelength, the performance is not reduced.

Figure 27:
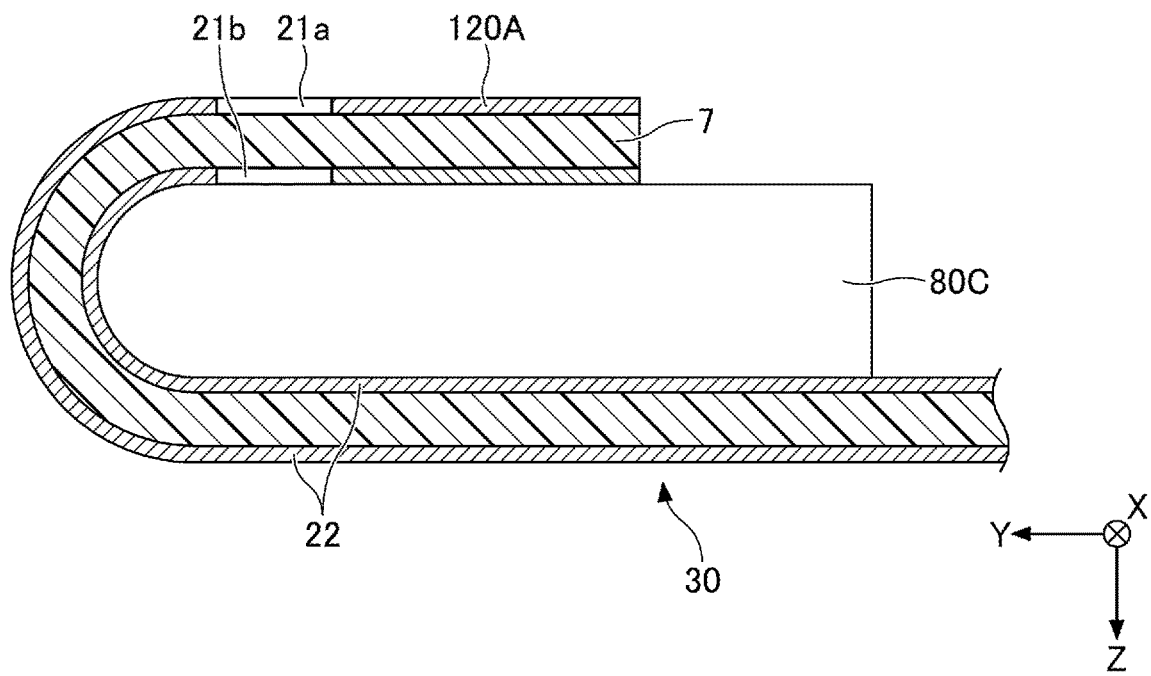
FIG. 27 is a cross-sectional view of an antenna 100-17 according to a seventeenth configuration example.

FIG. 27 is a cross-sectional view of an antenna 100-17 according to a seventeenth configuration example. Explanation about the configurations and effects similar to the above-described antenna is omitted or abbreviated by incorporating the above explanation by reference. The antenna 100-17 is different from the antenna 100-7 in that, in the antenna 100-17, a portion of the insulating member 80C where the flexible substrate 30 is bent (the end portion on the positive Y axis direction) is formed in a curved shape. The insulating member 80C is an example of an insulating spacer.

As is the insulating member 80, the insulating member 80C is a plate-shaped base material of which the main component is a dielectric. By using the insulating member 80C of which the portion where the flexible substrate 30 is bent is formed in the curved shape, the flexible substrate 30 is made into a gently curved surface at the corner portion of the insulating member 80C. When the flexible substrate 30 is bent with a small R (curvature radius), i.e., bent sharply, a difference in the extension rate increases between the inner side and the outer side of the flexible substrate 30, because the extension rates on the inner side and the outer side of the flexible substrate 30 are different, and therefore, a crack occurs in the flexible substrate 30. According to the antenna 100-17, the insulating member 80C is in the curved shape, which causes the flexible substrate 30 to be bent with a large R, so that the difference in the extension rates between the inner side and the outer side of the flexible substrate 30 can be reduced, and an effect of alleviating an occurrence of a crack can be achieved.

Figure 28:
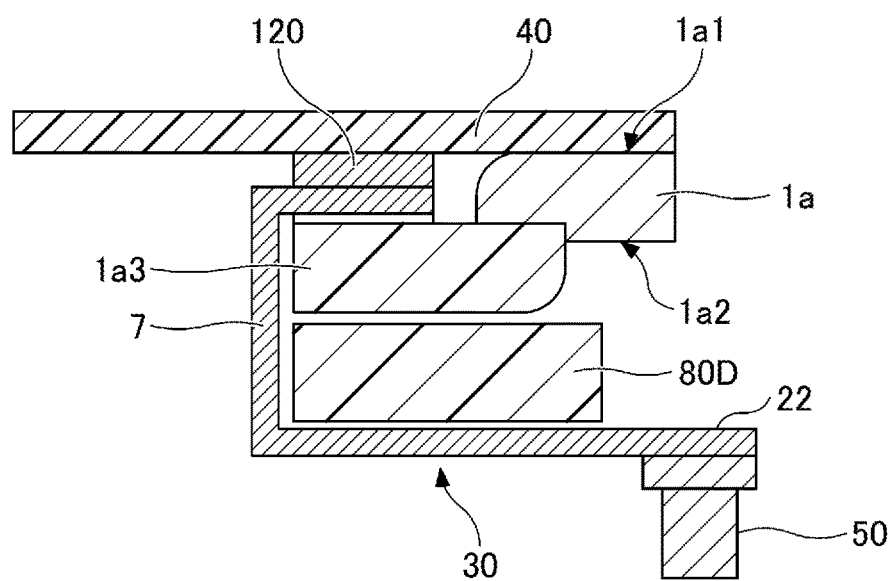
FIG. 28 is a cross-sectional view of an antenna 100-18 according to an eighteenth configuration example.

FIG. 28 is a cross-sectional view of an antenna 100-17 according to an eighteenth configuration example. Explanation about the configurations and effects similar to the above-described antenna is omitted or abbreviated by incorporating the above explanation by reference. An insulating member that is sandwiched by a portion where the dielectric 7 in the sheet shape is folded and that expands the distance from the antenna conductor 120 to the grounding conductor 22 may include multiple types of insulators (dielectrics). FIG. 28 illustrates an example of a case where the insulating member includes an insulator portion 1*a*3 of a chassis 1*a* and an insulating member 80D. By using a portion (the insulator portion 1*a*3) of the chassis 1*a* as the insulating member, the components constituting the antenna can be reduced.

An insulating member (a dielectric) such as the insulating member 80 (FIG. 9), the insulating member 80C (FIG. 27), the insulating member 80D (FIG. 28), or the insulator portion 1*a*3 may be a member having a curved surface or a member having flexibility capable of forming a curved surface. The term "flexibility" includes, for example, elasticity, bendability, and the like. When the insulating member is a member having a curved surface or a member having flexibility capable of forming a curved surface, a conformal antenna provided along a curved surface can be achieved. Specific examples of members having flexibility include a sponge, rubber, urethane, and the like.

An insulating member (a dielectric) such as the insulating member 80 has such a thickness that a predetermined bandwidth can be secured in a predetermined frequency band. For example, the thickness suitable for the insulating member can be derived by simulation and the like. For example, the insulating member is bonded to the surface of the flexible substrate 30 by any adhesive means (for example, an adhesive, double-sided tape, or the like).

In each configuration example, in a case where the design portion 40 is a coating film, the design portion 40 of the coating film may be provided in a portion of the flexible substrate 30 where a shield structure is formed, and a portion of the flexible substrate 30 where the shield structure is not formed (the dielectric of the flexible substrate 30) may be formed by a substantially transparent insulating member or a mesh-shaped insulating member. The portion where the shield structure is not formed is, for example, an area from an end portion of the signal line 21 on the positive Y axis direction to an end portion of the folded portion 31 on the positive Y axis direction, as illustrated in FIG. 2. According to this configuration, a portion where the design portion 40 of the coating film is not provided (the dielectric of the transmission line 20) can be made less noticeable, and the design of the antenna 100 is improved.

Although the antenna conductor is provided on the flexible substrate 30 in each configuration example, the antenna conductor may be provided on a rigid substrate instead of being provided on the flexible substrate 30. In this configuration, the substrate thickness can be increased, so that effects substantially the same as the effects obtained from the case where the above-described insulating member 80 is provided can be obtained.

Although the RF module 60 is provided on the back side of the chassis 1*a* (i.e., the interior-side surface 1*a*2) in each configuration example, the arrangement is not limited thereto as long as the antenna conductor 120 and the RF module 60 are separated from each other. For example, the position where the RF module 60 is provided may be the exterior-side surface 1*a*1 of the chassis 1*a*.

The configuration described in the above embodiment shows an example of configuration of the present invention. The configuration can be combined with another known technique, and a part of the configuration can be omitted or changed without departing from the subject matter described in the claims of the present application.

This international application claims priority to Japanese Patent Application No. 2019-109115 filed on Jun. 11, 2019, and the entire content of Japanese Patent Application No. 2019-109115 is incorporated into this international application by reference.

What is claimed is:
1. An antenna comprising:
an antenna conductor to be provided on an exterior side of a chassis; and
a flexible substrate including:
a first insulating portion that is a portion of a sheet-shaped dielectric where the sheet-shaped dielectric is folded;
a grounding conductor provided between the first insulating portion and the chassis;
a second insulating portion that is a portion of the sheet-shaped dielectric where the sheet-shaped dielectric is not folded; and
a signal line configured to feed power to the antenna conductor,
wherein a thickness of the first insulating portion is greater than a thickness of the second insulating portion.
2. The antenna according to claim 1, further comprising:
an insulating member sandwiched by a portion where the sheet-shaped dielectric is folded, the insulating member increasing a distance from the antenna conductor to the grounding conductor.
3. The antenna according to claim 1, further comprising:
a plurality of conductor patterns arranged spaced apart from each other across a portion where the sheet-shaped dielectric is folded.
4. The antenna according to claim 3, wherein the plurality of conductor patterns are provided at positions such that the plurality of conductor patterns do not come into contact with each other when the sheet-shaped dielectric is folded.
5. The antenna according to claim 1, wherein the signal line is a balanced transmission line connected in a loop antenna shape.

6. The antenna according to claim 1, wherein the signal line is a balanced transmission line including a delay line.

7. The antenna according to claim 1, wherein the flexible substrate has a structure bent into an L shape.

8. The antenna according to claim 1, wherein the signal line is a balanced transmission line, and
the antenna conductor is a dipole antenna connected to a transmission line provided on the flexible substrate via the balanced transmission line.

9. The antenna according to claim 1, comprising:
a support configured to hold a portion of the flexible substrate bent into an L shape, the portion extending in a direction substantially perpendicular to the chassis,
wherein the first insulating portion is formed on an opposite side of the support from the chassis, and
the second insulating portion is formed on a same side as the chassis with respect to the support.

10. The antenna according to claim 9, wherein the support includes a concave portion in a groove shape into which the portion of the flexible substrate extending in the direction substantially perpendicular is inserted.

11. The antenna according to claim 9, wherein the support is formed in a shape of a rectangular parallelepiped that is in contact with the portion of the flexible substrate extending in the direction substantially perpendicular.

12. The antenna according to claim 2, wherein, of a plurality of conductor posts constituting a substrate integrated waveguide formed in the flexible substrate, an arrangement interval of two conductor posts arranged across a position of the insulating member that is bent at a corner portion is greater than an arrangement interval of remaining conductor posts.

13. The antenna according to claim 2, wherein an end portion of the insulating member in contact with the flexible substrate is formed in a curved shape.

14. The antenna according to claim 2, wherein the insulating member is a member having a curved surface or is a member having flexibility to form a curved surface.

15. The antenna according to claim 2, wherein the insulating member includes a plurality of types of insulators.

16. The antenna according to claim 15, wherein the insulator includes an insulator portion of the chassis.

* * * * *